United States Patent
Mikoshiba et al.

[11] Patent Number: 5,824,150
[45] Date of Patent: Oct. 20, 1998

[54] PROCESS FOR FORMING DEPOSITED FILM BY USE OF ALKYL ALUMINUM HYDRIDE

[75] Inventors: Nobuo Mikoshiba; Kazuo Tsubouchi; Kazuya Masu, all of Sendai, Japan

[73] Assignee: Canon Kabushiki Kaisha, Tokyo, Japan

[21] Appl. No.: 948,401

[22] Filed: Oct. 10, 1997

Related U.S. Application Data

[60] Continuation of Ser. No. 580,486, Dec. 29, 1995, abandoned, which is a division of Ser. No. 264,498, Jun. 23, 1994, abandoned, which is a division of Ser. No. 902,829, Jun. 23, 1992, Pat. No. 5,328,873, which is a division of Ser. No. 578,672, Sep. 7, 1990, Pat. No. 5,179,042.

[30] Foreign Application Priority Data

| Sep. 9, 1989 | [JP] | Japan | 1-233924 |
| Sep. 9, 1989 | [JP] | Japan | 1-233926 |
| Jan. 16, 1990 | [JP] | Japan | 2-6557 |
| Jan. 16, 1990 | [JP] | Japan | 2-6558 |

[51] Int. Cl.⁶ ............................................. C30B 25/02
[52] U.S. Cl. ...................................................... 117/84
[58] Field of Search ........................ 117/2, 84; 118/719, 118/723 E, 723 R, 726

[56] References Cited

U.S. PATENT DOCUMENTS

| 4,926,793 | 5/1990 | Arima | 118/730 |
| 4,963,423 | 10/1990 | Sekiguchi et al. | 428/209 |
| 4,980,204 | 12/1990 | Fujii | 427/255.2 |
| 4,981,103 | 1/1991 | Sekiguchi et al. | 118/725 |
| 4,989,540 | 2/1991 | Fuse | 118/719 |
| 5,016,567 | 5/1991 | Iwabuchi | 118/733 |
| 5,029,554 | 7/1991 | Miyashita | 118/715 |
| 5,594,280 | 1/1997 | Sekiguchi et al. | 257/771 |

FOREIGN PATENT DOCUMENTS

| 0420595 A2 | 4/1991 | European Pat. Off. |
| 62-105422 | 5/1987 | Japan | H01L 21/285 |
| 62105422 | 5/1987 | Japan . |
| 1-198475 | 8/1989 | Japan | C23C 16/06 |
| 1198475 | 8/1989 | Japan . |

*Primary Examiner*—Felisa Garrett
*Attorney, Agent, or Firm*—Fitzpatrick, Cella, Harper & Scinto

[57] ABSTRACT

A process and apparatus for forming an Al film of good quality according to the CVD method utilizing the reaction between alkyl aluminum hydride and hydrogen, which is an excellent deposited film formation process also capable of selective deposition of Al. Pressure in a deposition chamber is maintained from $10^{-3}$ to 760 Torr. Alkyl aluminum hydride and hydrogen gas are introduced at a partial pressure from $1.5 \times 10^{-5}$ to $1.3 \times 10^{-3}$ of the pressure in the chamber. Aluminum is deposited on a substrate in the chamber by heating the substrate sufficiently to decompose the alkyl aluminum hydride.

14 Claims, 10 Drawing Sheets

× — DIRECT BEAM SPOT POSITION

× — DIRECT BEAM SPOT POSITION

PROCESS FOR FORMING DEPOSITED FILM BY USE OF ALKYL ALUMINUM HYDRIDE

This application is a continuation of application Ser. No. 08/580,486 filed Dec. 29, 1995, now abandoned, which is a divisional of Ser. No. 08/264,498 filed Jun. 23, 1994, abandoned, which is a divisional of Ser. No. 07/902,829 filed Jun. 23, 1992, now U.S. Pat. No. 5,328,873, which is a division of application Ser. No. 07/578,672 filed Sep. 7, 1990, now U.S. Pat. No. 5,179,042.

BACKGROUND OF THE INVENTION

1. Field of the Invention

This invention relates to a process for forming a deposited film, particularly a process for forming an Al deposited film which can be preferably applied to electrodes or wiring of a semiconductor integrated circuit device, etc.

2. Related Background Art

In the prior art, in electronic devices or integrated circuits using semiconductors, aluminum (Al) has been primarily used for electrodes and wiring. Al has many advantages. It is inexpensive and high in electroconductivity, it can also be internally chemically protected because a dense oxidized film can be formed on the surface, and it has good adhesion to Si, etc.

To form Al film for electrodes and wiring of Al or alloy as mentioned above, has used the prior art the sputtering method such as magnetron sputtering, etc. However, since sputtering is generally a physical deposition method based on flying sputtered particles in a vacuum, the film thickness at the stepped portion or the insulating film side wall becomes extremely thin, which can lead to a wire breaking in an extreme case. Nonuniformity of film thickness or wire breakage has the drawback that the reliability of Large Scale Integration LSI is markedly decreased.

On the other hand, as the degree of integration of the integrated circuits such as LSI, etc. increases, and miniaturization of wiring or multi-layer wiring has been required in recent years, there are increased demands which are not met by the Al wiring of the prior art. With greater miniaturization are increased degree of integration the surface of LSI, etc. is subject to excessive unevenness due to oxidation, diffusion, thin film deposition, and etching, etc. For example, electrodes or wiring metal must be deposited on the surface with a stepped difference, or deposited in a through-hole which is very small in diameter and deep. In 4 Mbit or 16 Mbit DRAM (dynamic RAM), etc., the aspect ratio (through-hole depth/through-hole diameter) of through-hole in which a metal composed mainly of Al such as Al, Al-Si, etc. is to be deposited is 1.0 or more, and the through-hole diameter itself becomes 1 $\mu$m or less. Therefore, even for a through-hole with a large aspect ratio, a technique which can deposit a metal is required.

In particularly, to ensure an electrical connection to the device under a insulating film such as $SiO_2$, etc., rather than film formation, Al must be deposited to embed only the through-hole of the device. In such a case, a method of depositing Al only on Si or metal surface, and not depositing it on an insulating film such as $SiO_2$, etc. is required.

Such selective deposition or selective growth cannot be realized by the sputtering method which has been used in the prior art.

The bias sputtering method in which a bias is applied on a substrate and deposition is performed to embed Al or an Al alloy only in the through-hole by utilizing the sputter-etching action and the deposition action on the substrate surface has been developed. However, since a bias voltage of some 100 V or higher is applied on the substrate, the device is adversely affected because of charged particle damage such as a change in the threshold of MOSFET, etc. Also, because both etching and deposition action are present, there is the problem that the deposition speed cannot be improved.

In order to solve the problems described above, various types of CVD (Chemical Vapor Deposition) methods have been proposed. In these methods, chemical reaction of the starting gas in some form is utilized. In plasma CVD or optical CVD, decomposition of the starting gas occurs in the gas phase, and the active species formed there further reacts on the substrate to form a film. In these CVD methods, due to the reaction in the gas phase, surface coverage on unevenness on the substrate surface is good. However, carbon atoms contained in the starting gas molecules are incorporated into the film. Also, particularly in plasma CVD, there was also damage by charged particles (so called plasma damage) as in the case of the sputtering method.

The thermal CVD method, in which the film grows through the surface reaction primarily on the substrate surface, provides good surface coverage on unevenness such as the stepped portion of the surface, etc. Also, it can be expected that deposition within the through-hole will readily occur. Further, wire breakage at the stepped portion can be avoided.

For such reasons, as the formation method of the thermal CVD method has been studied as the formation method for Al film. To form Al film using general thermal CVD, a method of transporting an organic aluminum dispersed in carrier gas to a heated substrate and pyrolyzing the gas molecules on the substrate to form a film is known. For example, in Journal of Electrochemical Society, Vol. 131, p. 2175 (1984), by use of triisobutyl aluminum (i-$C_4H_9$)$_3$Al (TIBA) as the organic aluminum gas, film formation is effected at a film formation temperature of 260° C. and a reaction tube pressure of 0.5 torr to form a film of 3.4 $\mu$ohm.cm.

Japanese Laid-open Patent Application No. 63-33569 describes a method of forming a film by using no $TiCl_4$, but using in place thereof organic aluminum such as TIBA and heating it in the vicinity of the substrate. According to this method, Al can be deposited selectively only on the metal or semiconductor surface from which the naturally oxidized film has been removed.

In this case, it is clearly stated that the step of removing the naturally oxidized film on the substrate surface is necessary before introduction of TIBA. Also, since TIBA can be used alone, no carrier gas is required, but Ar gas may be used as the carrier gas. However, the reaction of TIBA with another gas (e.g. $H_2$) is not contemplated, and there is no description of use of $H_2$ as the carrier gas. Also, in addition to TIBA, trimethyl aluminum (TMA) and triethyl aluminum (TEA) are mentioned, but there is no specific description of other organic metals. This is because, since the chemical properties of organic metals generally vary greatly if the organic substituent attached to the metal element varies, it is necessary to conduct detailed experimentation to determine what organic metal should be used.

In the CVD method as described above, not only is there an inconvenience that the naturally oxidized film must be removed, but also there is the drawback that surface smoothness can not be obtained. Also, there is the restriction that heating the gas is necessary, and heating must be done in the vicinity of the substrate. It must also be experimentally determined at what proximity to the substrate the heating must be done. Therefore there is also the problem that placement for the heater cannot be freely chosen.

In the pre-text of the 2nd Symposium of Electrochemical Society, Branch of Japan (Jul. 7, 1989), on page 75, film formation of Al according to the double wall CVD method. In this method is described, TIBA is used and the device is designed so that the gas temperature of TIBA can be made higher than the substrate temperature. This method may be also regarded as a modification of the above-mentioned Japanese Laid-open Patent Application No. 63-33569. Al can be selectively grown only on a metal or semiconductor in this method, but the difference between the gas temperature and the substrate surface temperature is controlled with difficulty, and there is the drawback that the bomb and the pipeline also be heated. Moreover, according to this method, no uniform continuous film can be formed, smoothness of the film is poor, Al selective growth cannot be maintained for a long time, etc., unless the film is made thick.

As described above, prior art methods cannot readily provide selective growth of Al, and even if possible, there is a problem with respect to smoothness, resistance, purity, etc. of the Al film formed. Also, there is the problem that the film formation method is complicated and difficult to control.

SUMMARY OF THE INVENTION

As described above, in the technical field of semiconductors where higher integration has been desired in recent years, to inexpensively provide a semiconductor device which is more highly integrated and has improved performances, there remained much room for improvement.

The present invention has been accomplished in view of the technical tasks described above, and an object of the present invention is to provide a process for forming a deposited film which can form an Al film (hereinafter referring comprehensively to pure Al and a metal composed mainly of Al) of good quality as the electroconductive material at a desired position with good controllability.

Another object of the present invention is to provide a process for forming a deposited film which can obtain an Al film which has extremely broad general purpose utility and yet is of good quality, without requiring a particularly complicated and expensive deposited film forming device.

Still another object of the present invention is to provide a process for forming a deposited film which can form an Al film with excellent surface characteristics, electrical characteristics, purity, etc. according to the CVD method utilizing alkyl aluminum hydride and hydrogen.

Still another object of the present invention is to provide a process for forming a deposited film of an Al film which has extremely broad general purpose utility and excellent selectivity, without requiring a particularly complicated and expensive deposited film forming device.

Still another object of the present invention is to provide a process for forming a deposited film which can form an Al film under good selectivity according to the CVD method utilizing alkyl aluminum hydride and hydrogen.

DETAILED DESCRIPTION OF THE PREFERRED EMBODIMENTS

Figure 1:
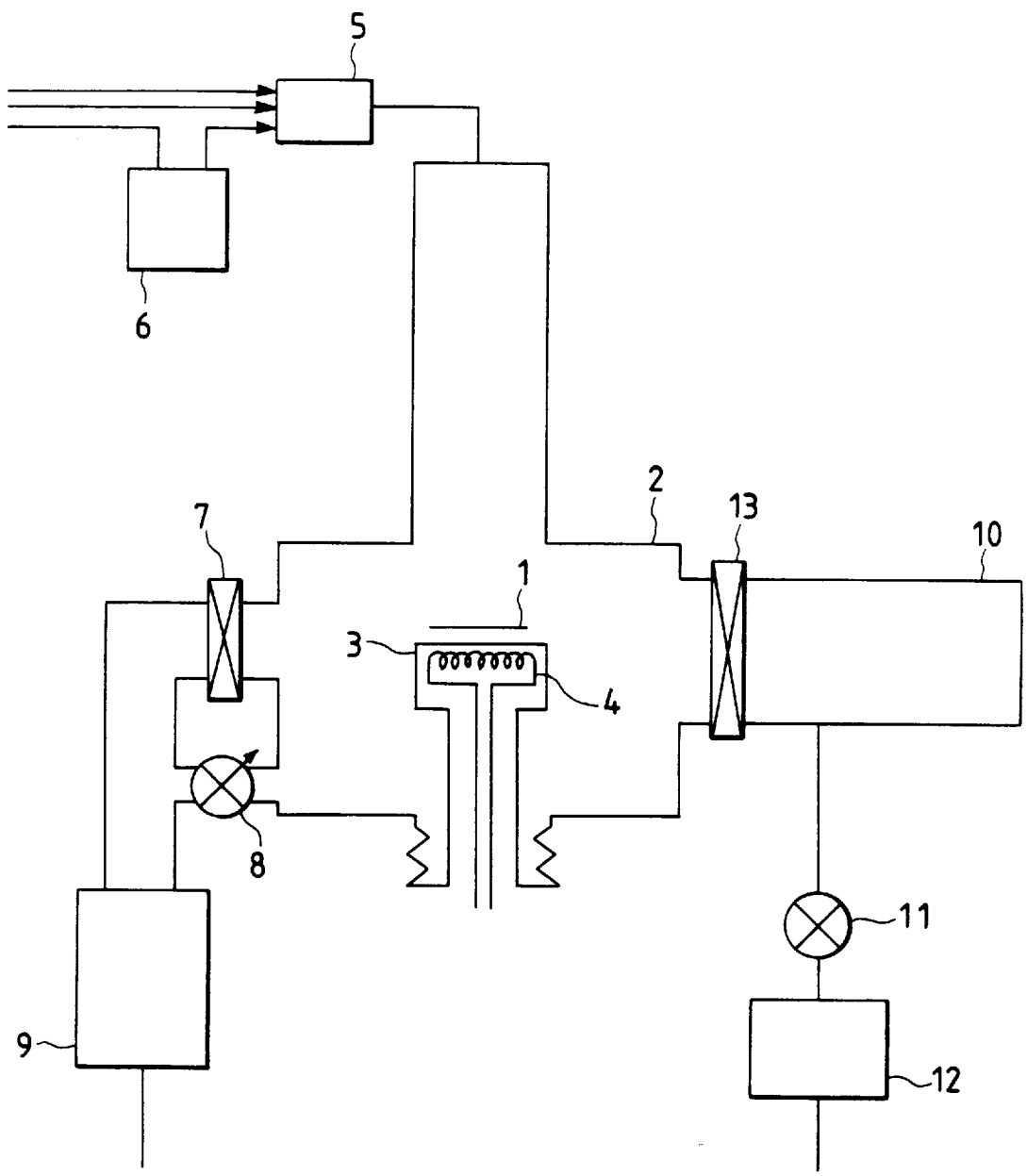
FIG. 1 is a schematic view for illustration of a suitable deposited film forming device in practicing the deposited film forming process according to the present invention.

Preferred embodiments according to the present invention are described in detail below, but the present invention is not limited by these embodiments, and it may have a constitution which accomplishes the object of the present invention.

One preferred embodiment of the present invention is a process for forming a deposited film comprising the steps of:

(a) providing a substrate having an electron donative surface (A) in a space for formation of the deposited film;

(b) introducing a gas of an alkyl aluminum hydride and hydrogen gas into the space for formation of the deposited film; and (c) maintaining the temperature of the electron donative surface (A) within the range of from the decomposition temperature of the alkyl aluminum hydride to 450° C. to form an aluminum film on the electron donative surface (A).

Further, another preferred embodiment of the present invention is a process for forming a deposited film comprising the steps of:

(a) providing a substrate having an electron donative surface (A) and an electron non-donative surface (B) in a space for formation of the deposited film;

(b) introducing a gas of an alkyl aluminum hydride and hydrogen gas into the space for formation of the deposited film; and (c) maintaining the temperature of the electron donative surface (A) within the range of from the decomposition temperature of the alkyl aluminum hydride to 450° C. to form an aluminum film selectively on the electron donative surface (A).

In the following, prior to detailed description, first, the process for forming a deposited film by use of an organic metal is outlined.

The decomposition reaction of an organic metal, and hence the thin film deposition reaction will vary greatly depending on the kind of the metal atom, the kind of the alkyl bonded to the metal atom, the means of causing the decomposition reaction to occur, the atmospheric gas, etc.

For example, in the case of $M-R_3$ (M: the group III metal, R: alkyl group), trimethyl gallium:

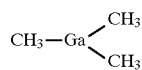

in thermal decomposition undergoes radical cleavage wherein $Ga-CH_3$ bond is cleaved, while triethyl gallium:

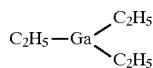

in thermal decomposition is decomposed through β-elimination into:

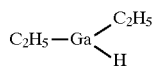

and $C_2H_4$. On the other hand, triethyl aluminum attached with the same ethyl group:

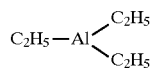

in thermal decomposition undergoes radical decomposition in which $Al-C_2H_5$ is cleaved. However, tri-iso-butyl aluminum having $iC_4H_9$ bonded therein:

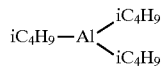

is subject to β-elimination.

Trimethyl aluminum (TMA) comprising $CH_3$ groups and Al has a dimer structure at room temperature:

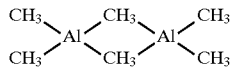

and thermal decomposition is radical decomposition in which $Al-CH_3$ group is cleaved, and at a temperature of 150° C. or lower, it reacts with atmospheric $H_2$ to form $CH_4$, and forms finally Al.

However, at a high temperature of 300° C. or higher, even if $H_2$ may be present in the atmosphere the, $CH_3$ group will withdraw H from the TMA molecule, until finally an Al-C compound is formed.

Also, in the case of TMA, in light or a certain region controlled in electric power in $H_2$ atmosphere high frequency (ca. 13.56 MHz) plasma, $C_2H_6$ will be formed by the bridging $CH_3$ between two Al's.

In essence, since even an organic metal comprising a $CH_3$ group which is the simplest alkyl group on, $C_2H_5$ group or $iC_4H_9$ group and Al or Ga has a reaction mode depending on the kind of the alkyl group, the kind of the metal atom, the excitation decomposition means. For deposition of a metal atom from an organic metal on a desired substrate, the decomposition reaction must be strictly controlled. For example, when Al is to be deposited from triisobutyl aluminum:

(TIBA: 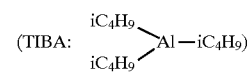

in the low pressure CVD method comprising mainly thermal reaction, unevenness of μm order is formed on the surface, whereby the surface morphology is inferior. Also, hillock generation by heat treatment, Si surface roughening through Si diffusion at the interface between Al and Si occur, and also migration resistance is inferior, whereby it is difficult to use this method for an ultra-LSI process.

For this reason, a method for controlling precisely both the gas temperature and the substrate temperature has been attempted. However, the device is complicated, and the method is of the sheet treatment type in which deposition can be effected only on one wafer by one deposition process. Besides, since the deposition speed is 500 Å/min. at the highest, the throughput necessary for bulk production cannot be realized.

Similarly, when TMA is employed, Al deposition has been attempted by use of plasma or light, the device becomes complicated due to use of plasma or light. Due to the sheet type device, there remains room for improvement of throughput.

Dimethyl aluminum hydride (DMAH) as the alkyl aluminum hydride to be utilized in the present invention is a substance known as an alkyl metal, but what Al thin film would be deposited depends on the reaction mode, unless a deposited film is formed under all conditions. For example, in an example of depositing Al by optical CVD from DMAH, the surface morphology is inferior, and the resistivity value was greater than the bulk value (2.7 μohm.cm) as several μohm to 10 μohm.cm, thus being inferior in film quality.

Now, referring to the drawings, preferred embodiments of the present invention are described in more detail.

In the present invention, to selectively deposit an Al film of good quality as the electroconductive deposition film on a substrate, the CVD method is used.

More specifically, by use of dimethyl aluminum hydride (DMAH):

Chemical formula: 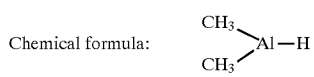

as the alkyl aluminum hydride which is an organic metal or monomethyl aluminum hydride ($MMAH_2$):

Chemical formula: 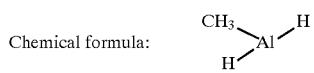

as the alkyl aluminum hydride as the starting gas containing at least one atom which becomes the constituent of the deposited film, and H$_2$ as the reaction gas, an Al film is formed by gas phase growth with a gas mixture of these on a substrate.

As the substrate in the present invention, a material having an electron donative surface may be employed.

The electron donative material is described in detail below.

The electron donative material refers to one having existing or free electrons intentionally formed in the substrate, for example, a material having a surface on which the chemical reaction is promoted through give-and-take of electrons with the starting gas molecules attached on the substrate surface. For example, generally metals and semiconductors correspond to such a material. Those having a very thin oxidized film on the metal or semiconductor surface are also included. With such a thin film, the chemical reaction can occur between the substrate and the attached starting molecules.

Specifically, there may be included semiconductors such as monocrystalline silicon, polycrystalline silicon, amorphous silicon, etc., binary system or ternary system or quaternary system III–V compound semiconductors comprising combinations of Ga, In, Al as the group III element and P, As, N as the group V element, or II–IV compound semiconducters, or metals themselves such as tungsten, molybdenum, tantalum, aluminum, titanium, copper, etc., or silicides of the above metals such as tungsten silicide, molybdenum silicide, tantalum silicide, aluminum silicide, titanium silicide, etc. Further metals containing either one of the constituent of the above metals such as aluminum silicon, aluminum titanium, aluminum copper, aluminum tantalum, aluminum silicon copper, aluminum silicon titanium, aluminum palladium, titanium nitride, may be used etc.

On the substrate with such a constitution, Al is deposited only through simple thermal reaction in the reaction system of the starting gas and H$_2$. For example, the thermal reaction in the reaction system between DMAH and H$_2$ may be basically considered as follows:

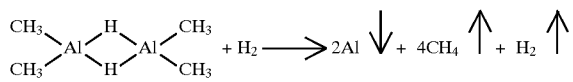

DMAH assumes a dimer structure at room temperature. Also, with MMAH$_2$, a high quality Al film could be formed by thermal reaction as shown below in the Examples.

Since MMAH$_2$ has low vapor pressure 0.01 to 0.1 Torr at room temperature, it is difficult to transport a large amount of the starting material and the upper limit value of the deposition speed is several hundred Å/min. in the present embodiment. Preferably, it is most desirable to use DMAH which has a vapor pressure of 1 Torr at room temperature.

In another embodiment of the present invention, the CVD method is used for selective deposition of a good Al film as the electroconductive deposition film on the substrate.

More specifically, as described above, by use of dimethyl aluminum hydride (DMAH) or monomethyl aluminum hydride (MMAH$_2$) and H$_2$ as the reaction gas, an Al film is selectively formed on the substrate by gas phase growth with a gas mixture of these.

The substrate applicable in the present invention has a first substrate surface material for formation of the surface on which Al is deposited, and a second substrate surface material on which no Al is deposited. And, as the first substrate surface material, a material having the electron donative surface is used.

The material for forming the surface on which Al is not deposited selectively, namely the material for forming the electron non-donative surface, conventional insulating materials, oxidized silicon formed by thermal oxidation, CVD, etc., glass or oxidized film such as BSG, PSG, BPSG, etc., thermally nitrided film, silicon nitrided film by plasma CVD, low pressure CVD, ECR-CVD method, etc. may be used.

FIG. 1 is a schematic view showing a preferable deposition film forming device for applying the present invention.

Here, 1 is a substrate for forming an Al film. The substrate 1 is mounted on a substrate holder 3 provided within the reaction tube 2 for forming a space to form a deposited film which is substantially closed. As the material constituting the reaction tube 2, quartz is preferable, but it may be also made of a metal. In this case, it is preferable to cool the reaction tube. The substrate holder 3 is made of a metal, and is provided with a heater 4 so that the substrate can be heated. The substrate temperature can be controlled by controlling the heat generation temperature of the heater 4.

The feeding system of gases is described below.

5 is a gas mixer, in which the starting gas and the reaction gas are mixed. The mixture is fed into the reaction tube 2. 6 is a starting gas gasifier provided for gasification of an organic metal as the starting gas.

The organic metal to be used in the present invention is liquid at room temperature, and is formed into saturated vapor by passing a carrier gas through the liquid of the organic metal within the gasifier 6, which is in turn introduced into the mixer 5.

The evacuation is constituted as described below.

7 is a gate valve, which is opened when performing evacuation of a large volume such as during evacuation of the reaction tube 2 before formation of the deposited film. 8 is a slow leak valve, which is used when performing evacuation of a small volume such as in controlling the pressure internally of the reaction tube 2 during formation of the deposited film. 9 is an evacuation unit, which is a pump for evacuation such as a turbo molecular pump, etc.

The conveying system of the substrate 1 is described below.

10 is a substrate conveying chamber which can house the substrate before and after formation of the deposited film, which is evacuated by opening the valve 11. 12 is an evacuation unit for evacuating the conveying chamber, which is a pump for evacuation such as a turbo molecular pump, etc.

The valve 13 is opened only when the substrate 1 is transferred between the reaction chamber and the conveying space.

As shown in FIG. 1, in the starting gas gasifier 6 which is the chamber for forming the starting gas, the liquid DMAH maintained at room temperature is bubbled with H$_2$ or Ar (or other inert gas) as the carrier gas to form gaseous DMAH, which is transported to the mixer 5. The H$_2$ gas as the reaction gas is transported through another route into the mixer 5. The gas flow rates are controlled so that the respective partial pressures may become desired values.

In forming a film by this device, the starting gas may be MMAH$_2$, but DMAH with a vapor pressure enough to become 1 Torr at room temperature is the most preferred. Also, DMAH and MMAH$_2$ may be used in a mixture.

The deposited film formed at a substrate temperature of 160° C. to 450° C. by use of such starting gas and reaction gas, with a thickness of for example 400 Å, has a resistivity at room temperature of 2.7–3.0 $\mu$ohm.cm which is substantially equal to Al bulk resistivity, and is a continuous and flat film. At this time, the pressure during film formation can be chosen within the range from 10$^{-3}$ Torr to 760 Torr. Also, even when the film thickness may be 1 $\mu$m, its resistivity is ca. 2.7–3.0 μohm.cm, and a sufficiently dense film can be formed also with a relatively thicker film. Also, the reflectance in the visible light wavelength region is approximately 80%, whereby a thin film with excellent surface flatness can be deposited.

The substrate temperature is desirably the decomposition temperature of the starting gas containing Al or higher, and 450° C. or lower as described above, but specifically the substrate temperature of 200° to 450° C. is more desirable, when deposition is carried out under these condition, by making the DMAH partial pressure $10^{-4}$ to $10^{-3}$ Torr, the deposition speed becomes as great as 100 Å/min. to 800 Å/min., whereby sufficiently great deposition speed corresponds to the cost as the Al deposition technique for ultra-LSI can be obtained.

A more preferable substrate temperature condition is 270° C. to 350° C., and the Al film deposited under these condition is also strongly orientatable and, even when subjected to the heat treatment at 450° C. for 1 hour, the Al film on the Si monocrystalline or Si polycrystalline substrate becomes a good Al film without generation of hillock, on spike as seen in the film forming method of the prior art. Also, such an Al film has excellent electro-migration resistance.

In the device shown in FIG. 1, Al can be deposited on only one sheet of substrate in deposition for one time. Although a deposition speed of ca. 800 Å/min. can be obtained, it is still insufficient to perform deposition of a large number of sheets within a short time.

As the improved deposition film forming device, there is a low pressure CVD device which can deposit Al by simultaneous mounting a large number of wafer sheets. Since the Al film formation according to the present embodiment utilizes the surface reaction on the electron donative substrate surface, in the hot wall type low pressure CVD method wherein only the substrate is heated, Al can be deposited on the substrate by use of DMAH and $H_2$.

The reaction tube pressure may be 0.05 to 760 Torr, desirably 0.1 to 0.8 Torr, the substrate temperature 160° C. to 450° C., desirably 200° C. to 400° C., the DMAH partial pressure $1 \times 10^{-5}$-fold to $1.3 \times 10^{-3}$-fold of the pressure in the reaction tube, and under such conditions, Al can be well deposited on the electron donative substrate.

Figure 2:
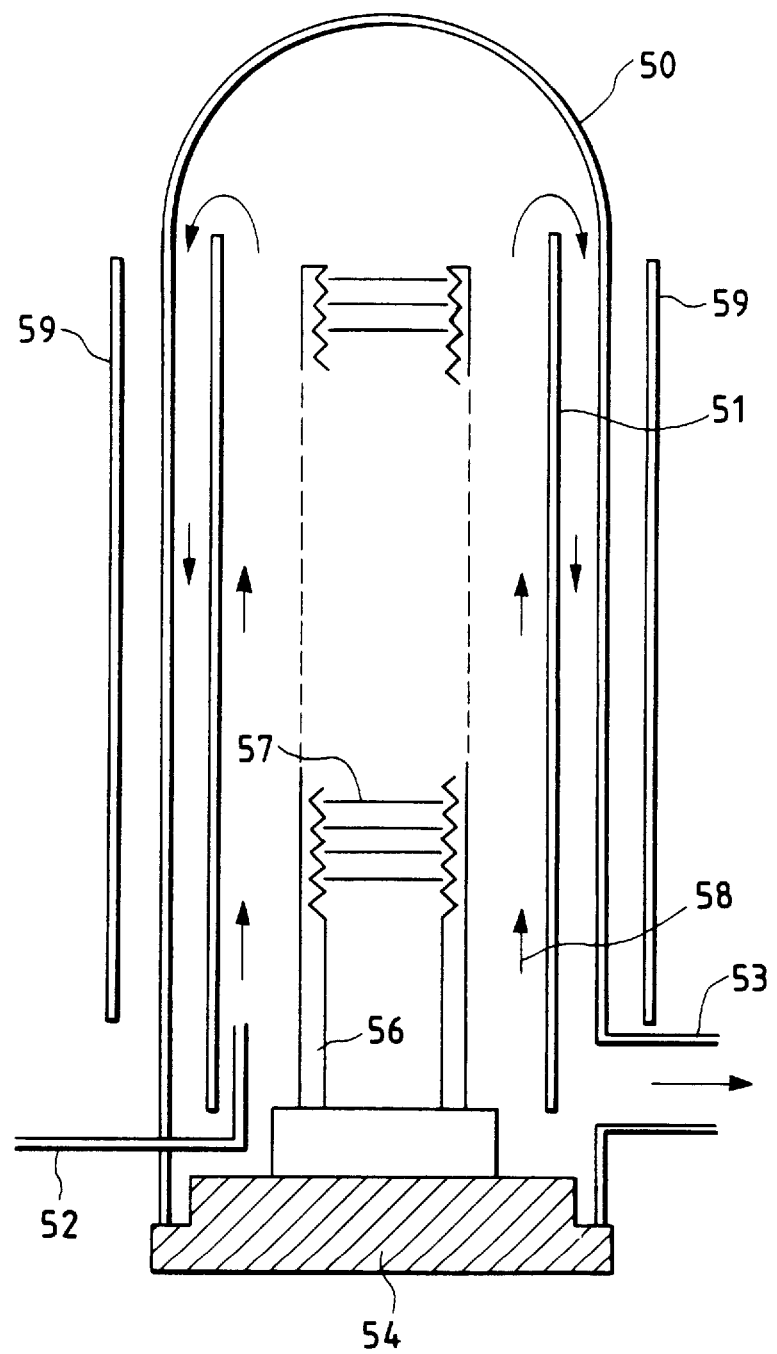
FIG. 2 is a schematic view for illustration of another suitable deposited film forming device in practicing the deposited film forming process according to the present invention.

FIG. 2 is a schematic illustration showing a deposited film forming device which is applicable to the present invention.

57 is a substrate for forming the Al film. 50 is an outside reaction tube made of quartz for forming a film formation space substantially closed to the surroundings, 51 is an innerside reaction tube made of quartz located for separating the flow of gas within the outside reaction tube 50, 54 is a flange made of a metal for opening and closing the opening of the outside reaction tube 50, and the substrate 57 is located within the substrate holding member 56 provided within the innerside reaction tube 51. The substrate holding member 56 should be preferably made of quartz.

Also, in the present device, the substrate temperature can be controlled by the heater portion 59. The pressure internally of the reaction tube 50 is constituted so as to be controllable by the evacuation system connected through the gas evacuation outlet 53.

The gas feeding system is constituted to have a first gas system, a second gas system and a mixer (none are shown) similarly as the device shown by the symbols 5 and 6 in FIG. 1, and the starting gas and the reaction gas are introduced into the reaction tube 50 through the starting gas inlet 52. These gases react on the surface of the substrate 57 during passage within the innerside reaction tube 51 as shown by the arrowhead 58 in FIG. 2 to deposit Al on the substrate surface. After the reaction the gases pass through the gap formed between the innerside reaction tube 51 and the outside reaction tube 50, and are evacuated through the gas evacuation outlet 53.

In taking the substrate out and in, the flange 54 made of a metal is permitted to fall by an elevator (not shown) together with the substrate holding member 56 and the substrate 57 to be moved to a predetermined position where the substrate is mounted and detached.

By forming a deposited film under the conditions as described above, Al films of good quality can be formed in all the wafers within the device.

As described above, the film obtained according to the Al film formation process of the present invention is dense, with little content of impurity such as carbon, etc. and resistivity similar to bulk, resistivity and also has high surface smoothness, and therefore the remarkable effects described below can be obtained.

(1) Reduction of hillock

Hillock is occurrence of concavities on the Al surface due to partial migration of Al when inner stress during film formation is released in the heat treatment step. Also, similar phenomenon occurs by local migration by current passage. The Al film formed by the present invention has little inner stress and is in the monocrystal line state or close to that. For this reason, in the heat treatment at 450° C. for one hour, as contrasted to formation of $10^4$–$10^6$/cm² of hillocks in the Al film of the prior art, the hillock number could be greatly improved as 0 to 10/cm². Thus, due to substantial absence of Al surface concavity, the resist film thickness and the interlayer insulating film can be made thin to be advantageous for making it finer and more flat.

(2) Improvement of electro-migration resistance

Electro-migration is the phenomenon that the wiring atoms move by passage of a current of high density. By this phenomenon, voids are generated and grow along the grain boundary, whereby as accompanied by a reduction of the cross-sectional area, the wiring is subject to thermal decomposition.

Migration resistance is generally evaluated the average wiring life.

The wiring formed by the sputtering method or the CVD method of the prior art has an average wiring life of $1 \times 10^2$ to $10^3$ hours (in the case of wiring with a cross-sectional area of 1 μm²) under the current passage test conditions of 250° C., $1 \times 10^6$ A/cm². In contrast, the Al film obtained by the Al film formation method based on the present invention can obtain an average wiring life of $10^3$ to $10^4$ hours with a wire having a cross-sectional area of 1 μm².

Hence, according to the present invention, for example, when the wiring width is 0.8 μm, a wiring layer thickness of 0.3 μm can withstand practical application. That is, since the wiring layer can be made thinner, any unevenness on the semiconductor surface after arranging of the wiring can be suppressed to a minimum, and also ordinary current can be passed with high reliability. This is possible by a very simple process.

(3) Improvement of surface smoothness (improvement of wiring patterning characteristic)

In the prior art, roughness of the surface of a metal thin film caused difficulties in aligning the mask and the substrate in the patterning step and in the etching step.

That is, there was unevenness extending to several μm on the surface of Al film according to the prior art method, whereby the surface morphology was poor, and therefore had the following disadvantages:

1) Alignment signals cause diffused reflection to occur at the surface, whereby noise level becomes higher and inherent alignment signals cannot be discriminated.

2) To cover large surface unevenness, the resist film thickness must be large, which is opposite to fine formation.

3) If the surface morphology is poor, halation due to the resist internal reflection will occur locally, whereby resist remaining occurs.

4) If the surface morphology is poor, the side wall becomes notched in the wiring etching step according to its unevenness.

According to the present invention, the surface morphology of Al film is markedly improved to prevent all the drawbacks described above.

(4) Improvement of resistance in contact hole and through hole and of contact resistance In the prior art method, if the size of the contact hole becomes finer than 1 $\mu m \times 1$ $\mu m$ or less, Si in the wiring is precipitated on the substrate of the contact hole during heat treatment in the wiring step to cover thereover, whereby resistance between the wiring and the element becomes markedly larger.

According to the embodiment of the present invention, since a dense film is formed according to the surface reaction, Al has been confirmed to have a resistivity of 2.7–3.3 $\mu$ohm cm. Also, the contact resistivity can attain $1 \times 10^{-6}$ ohm.cm$^2$ at an area of 0.6 $\mu m \times 0.6$ $\mu m$ when the Si portion has an impurity of $10^{20}$ cm$^{-3}$.

That is, according to the present invention, a good contact with the substrate can be obtained.

In other words, in the patterning step, at the line width of the resolving power limit of the exposure machine, the alignment precision $3\sigma=0.15$ $\mu m$ can be accomplished, whereby wiring having a smooth side plane is rendered possible without causing halation to occur.

(5) It becomes possible to reduce the heat treatment during the wiring step or to abolish the heat treatment step.

As described in detail above, by applying the present invention to the wiring formation method of a semiconductor integrated circuit, the yield can be improved, and cost can be reduced to a great extent as compared with Al wiring of the prior art.

FIGS. 3A–3E show how the Al film according to the present invention is selectively grown.

Figure 3A:
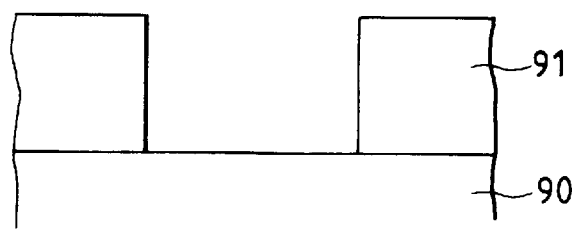
FIGS. 3A–3E are schematic sectional views for illustration of the deposited film forming process according to one embodiment of the present invention.

FIG. 3A is an illustration showing schematically the cross-section of the substrate before forming the Al deposited film according to the present invention. 90 is the substrate comprising an electron donative material, and 91 a thin film comprising an electron non-donative material.

Figure 3B:
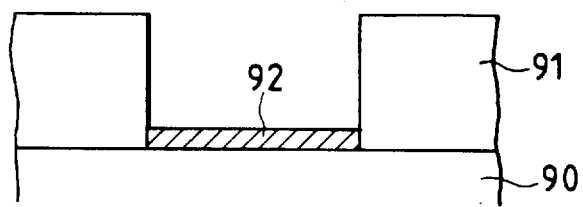

In the case of using DMAH as the starting gas, when a gas mixture containing H$_2$ as the reaction gas is fed onto the substrate 90 heated within a temperature range from the decomposition temperature of DMAH to 450° C., Al is precipitated on the substrate 90, whereby a continuous film of Al is formed as shown in FIG. 3B. Here, the pressure within the reaction tube 2 should be desirably $10^{-3}$ to 760 Torr, and the DMAH partial pressure preferably $1.5 \times 10^{-5}$ to $1.3 \times 10^{-3}$-fold of the pressure within the above reaction tube.

Figure 3C:
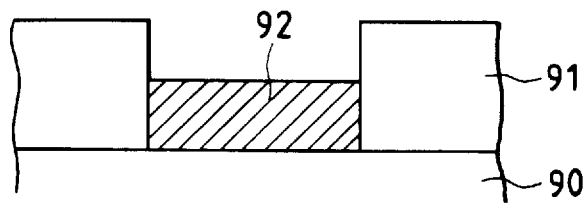
Figure 3D:
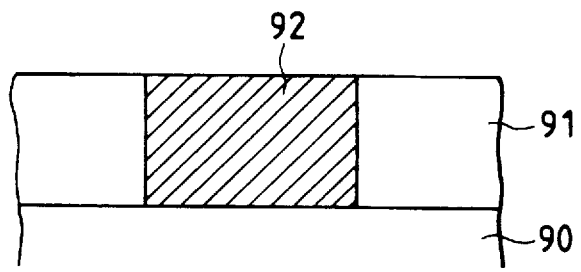
Figure 3E:
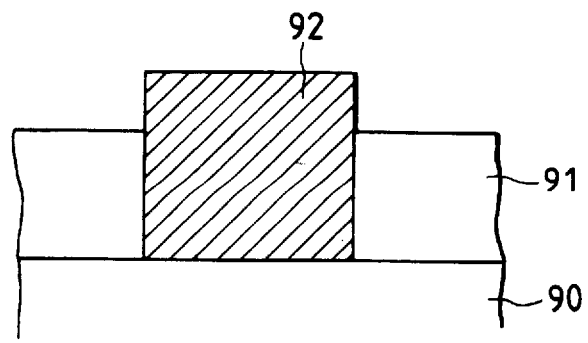

When deposit ion of Al i s continued under the above conditions, via the state of FIG. 3C, the Al film grows to the level of the uppermost portion of the thin film 91 as shown in FIG. 3D. Further, when grown under the same conditions, as shown in FIG. 3E, the Al film can grow to 5000 Å substantially without growth in the lateral direction. This is the most characteristic point of the deposited film obtained by the present invention, and it will be understood how a film of good quality can be formed under good selectivity.

As the result of analysis according to Auger's electron spectroscopy or photoelectric spectroscopy, no entrainment of an impurity such as carbon or oxygen is recognized in this film.

The deposited film thus formed has a resistivity of, for example, with a film thickness of 400 Å, 2.7–3.0 $\mu$ohm.cm at room temperature which is substantially equal to the bulk resistivity of Al, and becomes continuous and flat film. Also, even with a film thickness of 1 $\mu$m, its resistance at room temperature is approximately 2.7–3.0 $\mu$ohm.cm and a sufficiently dense film is formed with a relatively thicker film. The reflectance in the visible wavelength region is approximately 80%, and a thin film with excellent surface flatness can be deposited.

The substrate temperature in performing such selective deposition should be the decomposition temperature of the starting gas containing Al or higher and 450° C. or lower as mentioned above, but specifically a substrate temperature of 200° to 450° C. is desirable. When deposition is performed under such condition, the deposition speed is as great as 100 Å/min. to 800 Å/min. when DMAH partial pressure is $10^{-4}$ to $10^{-3}$ Torr. Thus a sufficiently great deposition speed can be obtained as the Al deposition technique for ultra-LSI.

A more preferable substrate temperature condition is 270° C. to 350° C., and the Al film deposited under this condition is also strongly orientatable and, even when subjected to the heat treatment at 450° C. for 1 hour, the Al film on the Si monocrystalline or Si polycrystalline substrate becomes a good Al film without generation of hillock on spike. Also, such Al film is excellent in electro-migration resistance.

Similarly in the case of selective deposition, in the device shown in FIG. 1, Al can be deposited on only one sheet of substrate at a time. Although a deposition speed of ca. 800 Å/min. can be obtained, it is still insufficient for performing deposition of a large number of sheets within a short time.

A low pressure CVD device can deposit Al by simultaneous mounting of a large number of sheets of wafer. Since the Al film formation according to the present embodiment utilizes the surface reaction of the electron donative substrate surface, in the hot wall type low pressure CVD method wherein only the substrate is heated, Al can be deposited on the substrate by use of DMAH and H$_2$.

The reaction tube pressure may be 0.05 to 760 Torr, desirably 0.1 to 0.8 Torr, the substrate temperature 160° C. to 450° C., desirably 200° C. to 400° C., the DMAH partial pressure $1 \times 10^{-5}$ fold to $1.3 \times 10^{-3}$-fold of the pressure in the reaction tube, and under such conditions, Al can be selectively deposited on only the electron donative substrate.

The deposited film forming device to which such present invention is applicable is the same as in FIG. 2 described above, and therefore its detailed description is omitted here.

By forming a deposited film under the conditions as described above by use of such device, Al films of good quality can be formed selectively and simultaneously in all the wafers within the device.

As described above, the film obtained according to the Al film selective formation process based on the embodiment of the present invention is dense with very little content of impurity such as carbon, etc. and resistivity which is similar to bulk, and also has high surface smoothness, and therefore remarkable effects as described below can be obtained.

(1) Reduction of hillock

The Al film formed according to the present invention has little internal stress and is under the state of monocrystal or approximate to that. For this reason, in the heat treatment at 450° C. for one hour, as contrasted to formation of $10^4$–$10^6$/cm$^2$ of hillocks in the Al film of the prior art, the hillock number could be greatly improved as 0 to 10/cm$^2$.

(2) Improvement of electro-migration resistance

The wiring formed by the method of the prior art has obtained an average wiring life of $1\times10^2$ to $10^3$ hours (in the case of a wiring cross-sectional area of 1 $\mu m^2$) under the current passage test conditions of 250° C., $1\times10^6$ A/cm$^2$. In contrast, the Al film obtained by the Al film selective formation method based on the embodiment of the present invention can obtain an average wiring life of $10^3$ to $10^4$ hours with a wiring having a cross-sectional area of 1 $\mu m^2$.

(3) Reduction of alloy pit in contact portion

The Al selectively formed according to the present invention can suppress generation of alloy pit at the contact portion with the substrate crystal even by the heat treatment during wiring step, and also a wiring with good contact characteristic can be obtained. That is, even when the junction is made shallow to the extent of 0.1 $\mu m$, the junction will not be destroyed with only the Al material.

(4) Improvement of surface smoothness (patterning characteristic improvement of wiring)

According to the present invention, the surface morphology of the Al film to be formed can be improved, whereby all of the problems of the prior art can be improved.

That is, in the patterning step, at the line width of the resolving power limit of the exposure machine, the alignment precision $3\sigma=0.15$ $\mu m$ can be accomplished, whereby wiring having smooth side plane is rendered possible without causing halation to occur.

(5) Improvement of resistance in contact hole and through hole and contact resistance According to the present invention, since a dense film is selectively formed by the surface reaction even when the opening may be 1 $\mu m\times 1$ $\mu m$ or less, it has been confirmed that the Al completely filled within the contact hole and through hole each has a resistivity of 2.7–3.3 $\mu ohm.cm$. Also, the contact resistivity can attain $1\times10^{-6}$ ohm.cm$^2$ in the case where the Si portion has an impurity of $10^{20}$ cm$^{-3}$ in a hole of 0.6 $\mu m\times 0.6$ $\mu m$.

That is, according to the present invention, the wiring material can be completely embedded only in the minute opening, and also good contact with the substrate can be obtained. Therefore, the present invention can contribute greatly to improvement of resistance within hole and contact resistance which have been the greatest problems in the fine process of 1 $\mu m$ or less.

(6) It is possible to make the heat treatment temperature during wiring step lower or to omit the heat treatment step.

As described in detail above, by applying the present invention to the wiring formation method of a semiconductor integrated circuit, particularly embedding of contact hole or through hole, the yield can be improved, and cost can be reduced to great extent as compared with Al wiring of the prior art.

EXAMPLE 1

First, the procedure for Al film formation is as follows. By use of the device shown in FIG. 1, the reaction tube 2 is internally evacuated to ca. $1\times10^{-8}$ Torr by the evacuation unit 9. However, Al film can also be formed if the vacuum degree within the reaction tube 2 is higher than $1\times10^{-8}$ Torr.

After washing the Si wafer, the conveying chamber 10 is released to atmospheric pressure and Si wafer is mounted in the conveying chamber. The conveying chamber is evacuated to ca. $1\times10^{-6}$ Torr, and then the gate valve 13 is opened and the wafer is mounted on the wafer holder 3.

After mounting of the wafer on the wafer holder 3, the gate valve 13 is closed, and the reaction chamber 2 is evacuated to a vacuum degree of ca. $1\times10^{-8}$ Torr.

In this Example, DMAH is fed through the first gas line. As the carrier gas of DMAH line H$_2$ which is the same as the reaction gas is employed. The second gas line is used for H$_2$.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5\times10^{-4}$ Torr. When DMAH is introduced into the reaction tube 2, Al is deposited. After a predetermined deposition time has elapsed, feeding of DMAH is stopped. Next, heating of the heater 4 is stopped to cool the wafer. Feeding of H$_2$ gas is stopped, and after evacuation internally of the reaction tube, the wafer is transferred to the conveying chamber, and only the conveying chamber is made atmospheric pressure before taking out the wafer. The outline of Al film formation is as described above.

EXPERIMENTAL EXAMPLE 1

Next, preparation of samples according to Example 1 is described.

130 Sheets of samples of monocrystalline Si substrates (N type, 1–2 ohm.cm) were prepared, the substrate temperatures were set at 13 levels, and Al films were deposited at the respective temperatures each for 10 sheets according to the procedure as described above under the following conditions:

whole pressure: 1.5 Torr
DMAH partial pressure: $1.5\times10^{-4}$ Torr.

The Al films deposited by varying the substrate temperature at 13 levels were evaluated by use of various evaluation methods. The results are shown in Table 1.

TABLE 1

| Evaluation item | Substrate temperature (°C.) | | | | | | | | | | | | |
|---|---|---|---|---|---|---|---|---|---|---|---|---|---|
| | 150 | 160 | 200 | 250 | 270 | 300 | 330 | 350 | 370 | 400 | 430 | 450 | 470 |
| Carbon content (%) | — | 0 | 0-* | 0 | 0 | 0 | 0 | 0 | 0 | 0 | 0 | 0 | 1~9 |
| Resistivity ($\mu\Omega \cdot cm$) | — | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 |
| Reflectance (%) | — | 85~95 | 85~95 | 85~95 | 85~95 | 85~95 | 85~95 | 85~95 | 85~95 | 85~95 | 70 | 60 or | 60 or |

TABLE 1-continued

| Evaluation item | Substrate temperature (°C.) | | | | | | | | | | | | |
|---|---|---|---|---|---|---|---|---|---|---|---|---|---|
| | 150 | 160 | 200 | 250 | 270 | 300 | 330 | 350 | 370 | 400 | 430 | 450 | 470 |
| Average wiring life (hour) | — | $10^3$~ $10^4$ | $10^3$~ $10^4$ | $10^3$~ $10^4$ | $10^3$~ $10^4$ | $10^3$~ $10^4$ | $10^3$~ $10^4$ | $10^3$~ $10^4$ | $10^3$~ $10^4$ | $10^3$~ $10^4$ | $10^3$~ $10^4$ | lower $10^3$~ $10^4$ | lower $10^3$~ $10^4$ |
| Deposition Speed (Å/min) | — | 1~9 | 100~800 | 100~800 | 100~800 | 100~800 | 100~800 | 100~800 | 100~800 | 100~800 | 100~800 | 100~800 | 1000 |
| Hillock density (cm$^{-2}$) | — | 0~ $10^3$ | 0~ $10^3$ | 0~ $10^3$ | 0~ 10 | 0~ 10 | 0~ 10 | 0~ 10 | 0~ $10^4$ | 0~ $10^4$ | 0~ $10^4$ | 0~ $10^4$ | 0~ $10^4$ |
| Spike generation ratio (%) | — | 0~10 | 0~10 | 0 | 0 | 0 | 0 | 0 | 0~30 | 0~30 | 0~30 | 0~30 | 0~30 |

Note: No deposition occurs at substrate temperature of 150° C.
Average wiring life is time to wire breaking when current is passed at a current density of $1 \times 10^6$ A/cm$^2$ through a cross-sectional area of 1 μm$^2$ at 250° C.
Spike generation ratio is destruction probability at the junction portion of 0.15 μm depth.

Al films of very good quality were obtained at a temperature range of 160° C. to 450° C., more preferably 200° C. to 400° C., optimally 270° C. to 350° C.

EXAMPLE 2

By the evacuation unit 9, the reaction tube 2 is evacuated internally to ca. $1\times10^{-8}$ Torr. Al film can be formed even if the vacuum degree in the reaction tube 2 may be higher than $1\times10^{-8}$ Torr.

After washing of the Si wafer, the conveying chamber 10 is released to atmospheric pressure and the Si wafer is mounted in the conveying chamber. The conveying chamber is evacuated to ca. $1\times10^{-6}$ Torr, then the gate valve 13 is opened and the wafer is mounted on the wafer holder 3.

After mounting of the wafer holder 3, the gate valve 13 is closed, and the reaction chamber 2 is evacuated to a vacuum degree of ca. $1\times10^{-8}$ Torr.

In this Example, the first gas line is used for DMAH. As the carrier gas for the DMAH line, Ar is employed. The second gas line is used for H$_2$.

By passing H$_2$ through the second gas line, the pressure within the reaction tube 2 is made a predetermined value by controlling the opening of the slow leak valve 8. A typical pressure in this Example is made approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5\times10^{-4}$ Torr. When DMAH is introduced into the reaction tube 2, Al is deposited. After a predetermined deposition time has elapsed, feeding of DMAH is stopped. Next, heating of the heater 4 is stopped to cool the wafer. Feeding of H$_2$ gas is stopped, and after evacuating the reaction tube, the wafer is transferred to the conveying chamber, and only the conveying chamber is made atmospheric pressure before taking out the wafer. The outline of Al film formation is as described above.

EXPERIMENTAL EXAMPLE 2

Al films were formed according to the method of Example 2. For the films obtained, the resistivity, carbon content, average wiring life, deposition speed, hillock density, generation of spike and reflectance, were the same in Example 1.

EXAMPLE 3

Example 3 performs deposition according to the same procedure by using MMAH$_2$ as the starting gas by setting the conditions as follows:
whole pressure: 1.5 Torr
MMAH$_2$ partial pressure: $5\times10^{-4}$ Torr.

EXPERIMENTAL EXAMPLE 3

According to the method of the above Example 3, films were formed by varying the substrate temperature within a temperature range from 160° C. to 400° C. As the result, Al thin films excellent in flatness, denseness, and containing no carbon impurity were deposited similarly as in Experimental example 1.

EXAMPLE 4

This Example 4 is a film formation according to the low pressure CVD method.

EXPERIMENTAL EXAMPLE 4

A monocrystalline silicon substrate was placed in the low pressure CVD device shown in FIG. 2, and Al film was formed within the same badge. The film formation conditions were a reaction tube pressure of 0.3 Torr, a DMAH partial pressure of $3.0\times10^{-5}$ Torr, a substrate temperature of 300° C., and a film formation time of 10 minutes.

Conditions. An Al film of 7000 Å was deposited. The film quality was very good, exhibiting the same properties as one prepared at a substrate temperature of 300° C. shown in Experimental example 1.

EXPERIMENTAL EXAMPLE 5

Samples having Al films formed according to the same method as in Example 1 were prepared. When crystallinity of the Al film deposited on the Si wafer of the respective samples, was examined by use of the X-ray diffraction method and the reflective electron beam diffraction method, it was found to be a monocrystalline Al.

First, the evaluation methods are described.

Figure 4:
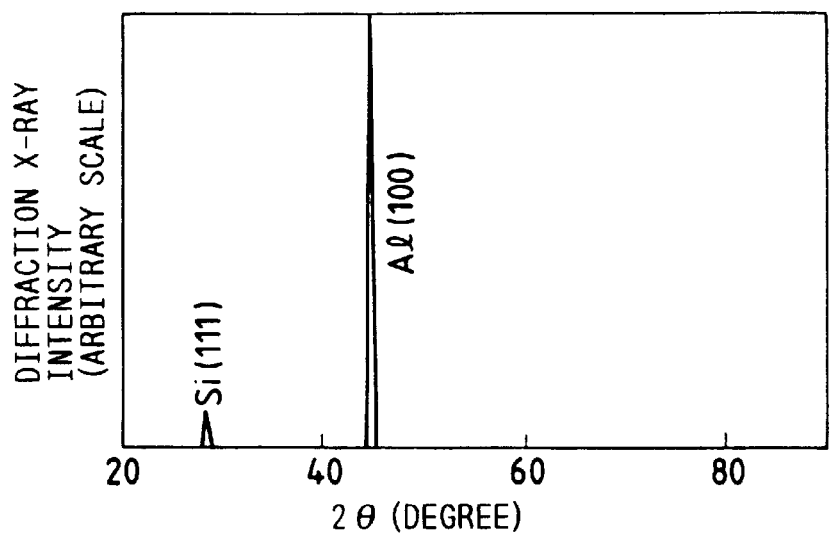
FIG. 4 is a chart showing the X-ray diffraction pattern of the Si (111) substrate having the Al film obtained according to the deposited film forming process of the present invention.
Figure 5A:
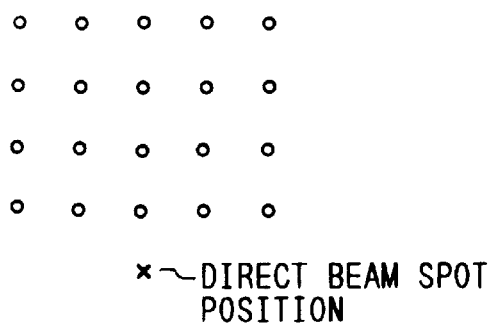
FIGS. 5A and 5B are charts showing the X-ray diffraction pattern of the Al film on the Si (111) substrate obtained according to the deposited film forming process of the present invention.
Figure 5B:
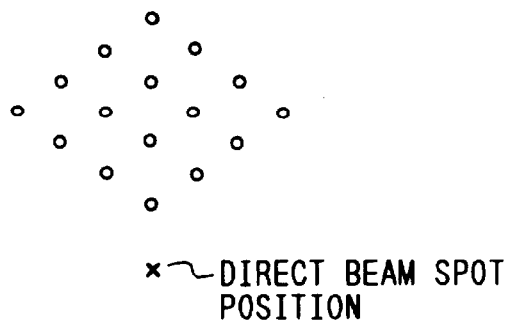

When the crystal direction of the Si substrate is (111) plane, from X-ray diffraction, as shown in FIG. 4, only the diffraction peak showing Al (100) was observed. In reflective high speed electron beam diffraction by use of an acceleration voltage of 80 kV or 100 kV, as shown in FIG. 5, a monocrystal spot showing Al (100) was observed. FIG. 5A is a diffraction pattern when an electron beam is permitted to enter Al (100) in the [001] direction. FIG. 5B a diffraction pattern when an electron beam is permitted to enter Al (100) in the direction of [011]. Thus, the Al film on the Si (111) substrate was found to be a monocrystal having a (100) plane. Within the substrate temperature range in Table 1, particularly those deposited at a range from 250° C. to 330° C. were found to have Al films deposited which were stably monocrystalline.

Also, the Al films deposited on the Si (111) substrate with the substrate surface having off-angles differing by 1°, 2°, 3°, 4°, 5° from the Si (111) plane were also found to have Al (100) monocrystals deposited stably, particularly under the temperature conditions of the substrate temperature ranging from 250° C. to 330° C., as in the case when deposited on the Si (111) substrate as described above.

Figure 6:
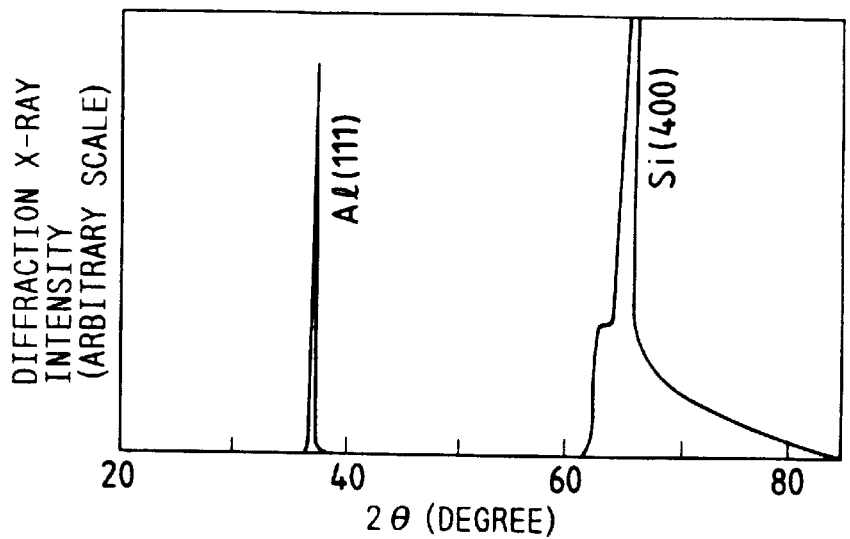
FIG. 6 is a chart showing the X-ray diffraction pattern on the Si (100) substrate having the Al film obtained according to the deposited film forming process of the present invention.

When the crystal direction of the Si substrate is (100) plane, from X-ray diffraction, as shown in FIG. 6, only the diffraction peak showing Al (111) was observed. In reflective high speed electron beam diffraction, by use of an acceleration voltage of 80 kV or 100 kV, a monocrystal spot showing Al (111) was observed. Thus, the Al film on the Si (100) substrate was found to be a monocrystal having (111) plane. Within the substrate temperature range in Table 1, particularly those deposited at a range from 250° C. to 330° C., were found to have Al films deposited which were stably monocrystalline. Also, the Al films deposited on the Si (100) substrate with the substrate surface having off-angles differing by 1°, 2°, 3°, 4°, 5° from the Si (100) plane were also found to have Al (111) monocrystals deposited stably, particularly under the temperature conditions of the substrate temperature ranging from 250° C. to 330° C., as in the case when deposited on the Si (111) substrate as described above.

EXPERIMENTAL EXAMPLE 6

Crystallinities of the Al films formed according to the method of Example 2 were evaluated. Similarly as in the case of Example 5, particularly within the range of the substrate temperature from 250° C. to 330° C., Al (100) monocrystals were formed on the Si (111) substrate, and Al (111) monocrystal on the Si (100) substrate.

EXPERIMENTAL EXAMPLE 7

Al films were formed on Si substrate according to the method of Example 3. As the result of evaluation of crystallinities of the Al films by the X-ray diffraction method and the reflective high speed electron beam diffraction method, the following results were obtained.

When the crystal direction of the Si substrate surface is (111) plane, from X-ray diffraction, as shown in FIG. 4, only the diffraction peak showing Al (100) was observed. In reflective high speed electron beam diffraction by use of an acceleration voltage of 80 kV or 100 kV, as shown in FIG. 5, a monocrystal spot showing Al (100) was observed. Thus, the Al film on the Si (111) substrate was found to be a monocrystal having (100) plane.

Also, the Al films deposited on the Si (111) substrate with the substrate surface having off-angles differing by 1°, 2°, 3°, 4°, 5° from the Si (111) plane were also found to have Al (100) monocrystals deposited, as in the case when deposited on the Si (111) substrate as described above.

When the crystal direction of the Si substrate is (100) plane, from X-ray diffraction, as shown in FIG. 6, only the diffraction peak showing Al (111) was observed. In reflective high speed electron beam diffraction by use of an acceleration voltage of 80 kV or 100 kV, a monocrystal spot showing Al (111) was observed. Thus, the Al film on the Si (100) substrate was found to be a monocrystal having (111) plane. Also, the Al films deposited on the Si (100) substrate with the substrate surface having off-angles differing by 1°, 2°, 3°, 4°, 5° from the Si (100) plane were also found to have Al (111) monocrystals deposited, similarly as in the case when deposited on the Si (111) substrate as described above.

The Examples 6 to 8 and the Experimental examples 8 to 16 are examples when forming Al films selectively.

EXAMPLE 5

First, the procedure or Al film formation according to this Example is as follows. By use of the device shown in FIG. 1, the reaction tube 2 is internally evacuated to ca. $1 \times 10^{-8}$ Torr by the evacuation unit 9. However, Al film can be also formed even if the vacuum degree within the reaction tube 2 may be higher than $1 \times 10^{-8}$ Torr.

After washing of the Si wafer treated so as to effect selective deposition, the conveying chamber 10 is released to atmospheric pressure and the Si wafer is mounted in the conveying chamber. The conveying chamber is evacuated to ca. $1 \times 10^{-6}$ Torr, then the gate valve 13 is opened and the wafer is mounted on the wafer holder 3.

After mounting of the wafer on the wafer holder 3, the gate valve 13 is closed, and the reaction chamber 2 is evacuated to 3 vacuum degree of ca. $1 \times 10^{-8}$ Torr.

In this Example, DMAH is fed through the first gas line. As the carrier gas of DMAH line, $H_2$ is employed. The second gas line is used for $H_2$. By passing $H_2$ through the second gas line, the pressure within the reaction tube 2 is made a predetermined value by controlling the opening of the slow leak valve 8. A typical pressure in this Example is approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5 \times 10^{-4}$ Torr. When DMAH is introduced into the reaction tube 2, Al is deposited. After a predetermined deposition time has elapsed, feeding of DMAH is stopped. Next, heating of the heater 4 is stopped to cool the wafer. Feeding of $H_2$ gas is stopped, and after evacuation internally of the reaction tube, the wafer is transferred to the conveying chamber, and only the conveying chamber is made atmospheric pressure before taking out the wafer. The outline of Al film formation is as described above.

EXPERIMENTAL EXAMPLE 8

Si substrates (N type, 1–2 ohm.cm) were subjected to thermal oxidation at a temperature of 1000° C. according to the hydrogen combustion system ($H_2$: 4 liters/M, $O_2$: 2 liters/M).

The film thickness was 7000 Å±500 Å, and the refractive index 1,46. A photoresist was coated on the whole Si substrate, and a desired pattern was baked by an exposure machine. The pattern was such that various holes of 0.25 $\mu$m×0.25 $\mu$m–100 $\mu$m×100 $\mu$m were opened. After development of the photoresist, with the photoresist as the mask, the subbing $SiO_2$ was etched by the reactive ion etching (RIE), etc. to have the substrate Si partially exposed. Thus, 130 sheets of samples having various sizes of $SiO_2$ holes of 0.25

μm×0.25 μm–100 μm×100 μm were prepared, the substrate temperature was set at 13 levels, and for the samples each of 10 sheets at the respective temperatures, Al films were selectively deposited following the procedure as described above under the following conditions:
whole pressure: 1.5 Torr
DMAH partial pressure: $1.5 \times 10^{-4}$ Torr.

The Al films deposited by varying the substrate temperature at 13 levels were evaluated by use of various evaluation methods. The results are shown in Table 2.

TABLE 2

| Evaluation item | Substrate temperature (°C.) | | | | | | | | | | | | |
|---|---|---|---|---|---|---|---|---|---|---|---|---|---|
| | 150 | 160 | 200 | 250 | 270 | 300 | 330 | 350 | 370 | 400 | 430 | 450 | 470 |
| Carbon content (%) | — | 0 | 0 | 0 | 0 | 0 | 0 | 0 | 0 | 0 | 0 | 0 | 1~9 |
| Resistivity ($\mu\Omega \cdot$ cm) | — | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 | 2.7~3.3 |
| Reflectance (%) | — | 85~95 | 85~95 | 85~95 | 85~95 | 85~95 | 85~95 | 85~95 | 85~95 | 85~95 | 70 | 60 or lower | 60 or lower |
| Average wiring life (hour) | — | $10^3$~$10^4$ | $10^3$~$10^4$ | $10^3$~$10^4$ | $10^3$~$10^4$ | $10^3$~$10^4$ | $10^3$~$10^4$ | $10^3$~$10^4$ | $10^3$~$10^4$ | $10^3$~$10^4$ | $10^3$~$10^4$ | $10^3$~$10^4$ | $10^3$~$10^4$ |
| Deposition Speed (Å/min) | — | 1~9 | 100~800 | 100~800 | 100~800 | 100~800 | 100~800 | 100~800 | 100~800 | 100~800 | 100~800 | 100~800 | 1000 |
| Hillock density (cm$^{-2}$) | — | 0~$10^3$ | 0~$10^3$ | 0~$10^3$ | 0~10 | 0~10 | 0~10 | 0~10 | 0~$10^4$ | 0~$10^4$ | 0~$10^4$ | 0~$10^4$ | 0~$10^4$ |
| Spike generation ratio (%) | — | 0~10 | 0~10 | 0 | 0 | 0 | 0 | 0 | 0~30 | 0~30 | 0~30 | 0~30 | 0~30 |

Note: No deposition occurs at substrate temperature of 150° C.
Average wiring life is time to wire breaking when current is passed at a current density of $1 \times 10^6$ A/cm$^2$ through a cross-sectional area of 1 μm$^2$ at 250° C.
Spike generation ratio is destruction probability at the junction portion of 0.15 μm depth.

In the above samples, no Al was deposited on SiO$_2$ at a temperature range from 160° C. to 450° C., and Al was deposited only on the portion with opening of SiO$_2$ to have Si exposed. Also, when deposition was carried out in the above temperature range continuously for 2 hours, similar selective deposition was maintained.

EXAMPLE 6

By the evacuation unit 9, the reaction tube 2 is evacuated to ca. $1 \times 10^{-8}$ Torr. Al film can be formed even if the vacuum degree in the reaction tube 2 is higher than $1 \times 10^{-8}$ Torr.

After washing the Si wafer, the conveying chamber 10 is released to atmospheric pressure and the Si wafer is mounted in the conveying chamber. The conveying chamber is evacuated to ca. $1 \times 10^{-6}$ Torr, then the gate valve 13 is opened and the wafer is mounted on the wafer holder 3.

After mounting of the wafer on the wafer holder 3, the gate valve 13 is closed and the reaction chamber 2 is evacuated to a vacuum degree of ca. $1 \times 10^{-8}$ Torr.

In this Example, the first gas line is used for DMAH. As the carrier gas for the DMAH line, Ar is employed. The second gas line is used for H$_2$.

By passing H$_2$ through the second gas line, the pressure within the reaction tube 2 is made a predetermined value by controlling the opening of the slow leak valve 8. A typical pressure in this Example is approximately 1.5 Torr. Then, the wafer is heated by current passage through the heater 4. After the wafer temperature has reached a predetermined temperature, DMAH is introduced into the reaction tube through the DMAH line. The whole pressure is ca. 1.5 Torr, and the DMAH partial pressure is made ca. $1.5 \times 10^{-4}$ Torr. When DMAH is introduced into the reaction tube 2, Al is deposited. After a predetermined deposition time has elapsed, feeding of DMAH is stopped. Next, heating of the heater 4 is stopped to cool the wafer. Feeding of H$_2$ gas is stopped, and after evacuation of the reaction tube, the wafer is transferred to the conveying chamber, and only the conveying chamber is made atmospheric pressure before taking out the wafer. The outline of Al film formation is as described above.

EXPERIMENTAL EXAMPLE 9

Al films were formed according to the method of Example 6. For the films obtained, the resistivity, carbon content, average wiring life, deposition speed, hillock density, generation of spike and reflectance, the same results as in Experimental example 8 were obtained.

Also, selective depositability with substrate was the same as in Experimental example 8.

EXAMPLE 7

This Example is selective deposition of Al according to the low pressure CVD method.

EXPERIMENTAL EXAMPLE 10

By means of the low pressure CVD device shown in FIG. 2, Al films were formed on the substrates with the constitutions as described below (Samples 5-1–5-179).

Preparation of Sample 5-1

On a monocrystalline silicon as the electron donative first substrate surface material, a thermally oxidized SiO$_2$ film as the electron non-donative second substrate surface material was formed, and patterning was effected according to the photolithographic steps as shown in Example 1 to have the monocrystalline surface partially exposed.

The film thickness of the thermally oxidized SiO$_2$ film wag found to be 7000 Å, with the size of the exposed portion of the monocrystalline silicon, namely opening being 3 μm×3 μm, Thus, Sample 5-1 was prepared. (Hereinafter, such sample is expressed as "thermally oxidized SiO$_2$ (hereinafter abbreviated as T-SiO$_2$)/monocrystalline silicon".

Preparation of Samples 5-2–5-179

Sample 5-2 is an oxidized film formed by normal pressure CVD (hereinafter abbreviated as SiO$_2$)/monocrystalline silicon.

Sample 5-3 is a boron doped oxidized film formed by normal pressure CVD (hereinafter abbreviated as BSG)/monocrystalline silicon.

Sample 5-4 is a phosphorus doped oxidized film formed by normal pressure CVD (hereinafter abbreviated as PSG)/monocrystalline silicon.

Sample 5-5 is a phosphorus and boron doped oxidized film formed by normal pressure CVD (hereinafter abbreviated as BSPG)/monocrystalline silicon.

Sample 5-6 is a nitrided film formed by plasma CVD (hereinafter abbreviated as P-S:N)/monocrystalline silicon.

Sample 5-7 is a thermally nitrided film (hereinafter abbreviated as T-S:N)/monocrystalline silicon.

Sample 5-8 is a nitrided film formed by low pressure CVD (hereinafter abbreviated as LP-S:N)/monocrystalline silicon.

Sample 5-9 is a nitrided film formed by ECR device (hereinafter abbreviated as ECR-SiN)/monocrystalline silicon.

Further, by combinations of the electron donative first substrate surface materials and the electron non-donative second substrate surface materials, Samples 5-11–5-179 shown in Table 3 were prepared. As the first substrate surface material, monocrystalline silicon (monocrystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (TiN), copper (Cu), aluminum silicon copper (Al-Si-Cu), aluminum palladium (Al-Pd), titanium (Ti), molybdenum silicide (Mo-Si), tantalum silicide (Ta-Si) were employed. These samples and Al$_2$O$_3$ substrates, SiO$_2$ glass substrates were placed in the low pressure CVD device shown in FIG. 2, and Al films were formed within the same badge. The film forming conditions were a reaction tube pressure of 0.3 Torr, a DMAH partial pressure of 3.0×10$^{-5}$ Torr, a substrate temperature of 300° C. and a film formation time of 10 minutes.

As the result of film formation under such conditions, concerning all the samples applied with patterning from Sample 5-1 to 5-179, deposition of Al film occurred only on the electron donative first substrate surface film to embed completely the opening with the depth of 7000 Å. The film quality of the Al film was found to be very good, exhibiting the same properties as one prepared at a substrate temperature of 300° C. shown in Experimental example 8. On the other hand, on the second substrate surface which is electron non-donative, no Al film was deposited at all, whereby complete selectivity was obtained. On both the Al$_2$O$_3$ substrate and the SiO$_2$ glass substrate which are electron non-donative, no Al film was deposited at all.

EXPERIMENTAL EXAMPLE 11

By use of the low pressure CVD device shown in FIG. 2, Al film was formed on the substrate with the constitution as described below.

On a thermally oxidized film as the electron non-donative second substrate surface material, a polycrystalline Si as the electron donative first substrate surface material was formed, patterning was effected according to the photolithographic steps as shown in Example 1 to have the thermally oxidized film surface partially exposed. The film thickness of the polycrystalline silicon at this time was 2000 Å, with the size of the thermally oxidized film exposed portion, being 3 μm×3 μm. Such sample is called 6-1. By combinations of the electron non-donative second substrate surface materials (T-SiO$_2$, CVD-SiO$_2$, BSG, PSG, BPSG, P-SiN, T-SiN, LP-SiN, ECR-S:N) and the electron-donative first substrate surface materials (polycrystalline Si, amorphous Si, Al, W, Mo, Ta, WSi, TiSi, TaSi, Al-Si, Al-Ti, TiN, Cu, Al-Si-Cu, Al-Pd, Ti, Mo-Si), Samples of 6-1–6-169 shown in Table 3 were prepared. These samples were placed in the low CVD device shown in FIG. 2, and Al film was formed within the same badge. The film forming conditions were a reaction tube pressure of 0.3 Torr, a DMAH partial pressure of 3.0×10$^{-5}$ Torr, a substrate temperature of 300° C. and a film forming time of 10 minutes. As the result of film formation under such conditions, in all the samples from 6-1 to 6-169, no Al film was deposited at all at the opening having the electron non-donative second substrate exposed, but Al of about 7000 Å was deposited only on the electron donative first substrate, whereby complete selectivity was obtained. The film quality of the Al film deposited was found to be very good, exhibiting the same properties as one prepared at a substrate temperature of 300° C. in Experimental example 1.

TABLE 3

|  | Monocrystalline Si | Polycrystalline Si | Amorphous Si | W | Mo | Ta | WSi | TiSi | Al | AlSi |
|---|---|---|---|---|---|---|---|---|---|---|
| T—SiO$_2$ | 5-1 | 5-11 | 5-21 | 5-31 | 5-41 | 5-51 | 5-61 | 5-71 | 5-81 | 5-91 |
| SiO$_2$ | 5-2 | 5-12 | 5-22 | 5-32 | 5-42 | 5-52 | 5-62 | 5-72 | 5-82 | 5-92 |
| BSG | 5-3 | 5-13 | 5-23 | 5-33 | 5-43 | 5-53 | 5-63 | 5-73 | 5-83 | 5-93 |
| PSG | 5-4 | 5-14 | 5-24 | 5-34 | 5-44 | 5-54 | 5-64 | 5-14 | 5-84 | 5-94 |
| BPSG | 5-5 | 5-15 | 5-25 | 5-35 | 5-45 | 5-55 | 5-65 | 5-75 | 5-85 | 5-95 |
| P—SiN | 5-6 | 5-16 | 5-26 | 5-36 | 5-46 | 5-56 | 5-66 | 5-76 | 5-86 | 5-96 |
| T—SiN | 5-7 | 5-17 | 5-27 | 5-37 | 5-47 | 5-57 | 5-67 | 5-77 | 5-87 | 5-97 |
| LP—SiN | 5-8 | 5-18 | 5-28 | 5-38 | 5-48 | 5-58 | 5-68 | 5-78 | 5-88 | 5-98 |
| ECR—SiN | 5-9 | 5-19 | 5-29 | 5-39 | 5-49 | 5-59 | 5-69 | 5-79 | 5-89 | 5-99 |

TABLE 3-continued

|  | AlTi | Ti—N | Cu | Al—Si—Cu | AlPd | Ti | Mo—Si | Ta—Si |
|---|---|---|---|---|---|---|---|---|
| T—SiO$_2$ | 5-101 | 5-111 | 5-121 | 5-131 | 5-141 | 5-151 | 5-161 | 5-171 |
| SiO$_2$ | 5-102 | 5-112 | 5-122 | 5-132 | 5-142 | 5-152 | 5-162 | 5-172 |
| BSG | 5-103 | 5-113 | 5-123 | 5-133 | 5-143 | 5-153 | 5-163 | 5-173 |
| PSG | 5-104 | 5-114 | 5-124 | 5-131 | 5-144 | 5-154 | 5-164 | 5-174 |
| BPSG | 5-105 | 5-115 | 5-125 | 5-135 | 5-145 | 5-155 | 5-165 | 5-175 |
| P—SiN | 5-106 | 5-116 | 5-126 | 5-136 | 5-146 | 5-156 | 5-166 | 5-176 |
| T—SiN | 5-107 | 5-117 | 5-127 | 5-137 | 5-147 | 5-157 | 5-167 | 5-177 |
| LP—SiN | 5-108 | 5-118 | 5-128 | 5-138 | 5-148 | 5-158 | 5-168 | 5-178 |
| ECR—SiN | 5-109 | 5-119 | 5-129 | 5-139 | 5-149 | 5-159 | 5-169 | 5-179 |

(note) Numeral shows sample No.

TABLE 4

|  | Poly-Crystal-line Si | Amor-phous Si | W | Mo | Ta | WSi | TiSi | Al | AlSi | AlTi | Ti—N | Cu | Al—Si—Cu | AlPd | Ti | Mo—Si | Ta—Si |
|---|---|---|---|---|---|---|---|---|---|---|---|---|---|---|---|---|---|
| T—SiO$_2$ | 6-1 | 6-11 | 6-21 | 6-31 | 6-41 | 6-51 | 6-61 | 6-71 | 6-81 | 6-91 | 6-101 | 6-111 | 6-121 | 6-131 | 6-141 | 6-151 | 6-161 |
| SiO$_2$ | 6-2 | 6-12 | 6-22 | 6-32 | 6-42 | 6-52 | 6-62 | 6-72 | 6-82 | 6-92 | 6-102 | 6-112 | 6-122 | 6-132 | 6-142 | 6-152 | 6-162 |
| BSG | 6-3 | 6-13 | 6-23 | 6-33 | 6-43 | 6-53 | 6-63 | 6-73 | 6-83 | 6-93 | 6-103 | 6-113 | 6-123 | 6-133 | 6-143 | 6-153 | 6-163 |
| PSG | 6-4 | 6-14 | 6-24 | 6-34 | 6-44 | 6-54 | 6-64 | 6-74 | 6-84 | 6-94 | 6-104 | 6-114 | 6-121 | 6-134 | 6-144 | 6-154 | 6-164 |
| BPSG | 6-5 | 6-15 | 6-25 | 6-35 | 6-45 | 6-55 | 6-65 | 6-75 | 6-85 | 6-95 | 6-105 | 6-115 | 6-125 | 6-135 | 6-145 | 6-155 | 6-165 |
| P—SiN | 6-6 | 6-16 | 6-26 | 6-36 | 6-46 | 6-56 | 6-66 | 6-76 | 6-85 | 6-96 | 6-106 | 6-116 | 6-126 | 6-136 | 6-146 | 6-156 | 6-166 |
| T—SiN | 6-7 | 6-17 | 6-27 | 6-37 | 6-47 | 6-57 | 6-67 | 6-77 | 6-87 | 6-97 | 6-107 | 6-117 | 6-127 | 6-137 | 6-147 | 6-157 | 6-167 |
| LP—SiN | 6-8 | 6-18 | 6-28 | 6-38 | 6-48 | 6-58 | 6-68 | 6-78 | 6-88 | 6-98 | 6-108 | 6-118 | 6-128 | 6-138 | 6-148 | 6-158 | 6-168 |
| ECR—SiN | 6-9 | 6-19 | 6-29 | 6-39 | 6-49 | 6-59 | 6-69 | 6-79 | 6-89 | 6-99 | 6-109 | 6-119 | 6-129 | 6-139 | 6-149 | 6-159 | 6-169 |

(note) Numeral shows sample No.

EXAMPLE 8

This Example is the method of depositing Al selectively by use of MMAH$_2$.

EXPERIMENTAL EXAMPLE 12

Deposition was carried out according to the same procedure as shown in Example 1 using MMAH$_2$ as the starting gas and setting the conditions as follows:
whole pressure: 1.5 Torr
MMAH$_2$ partial pressure: $5 \times 10^{-4}$ Torr,
in the temperature range of the substrate temperature from 160° C. to 400° C. An Al thin film containing no carbon impurity and having excellent flatness, denseness and selectivity with the substrate surface materials was deposited similarly as in Example 1.

EXPERIMENTAL EXAMPLE 13

According to the same method as in Example 5, a sample having an Al film formed thereon was prepared. The crystallinity of the Al film selectively deposited on Si at the same substrate temperature as in Table 1 was evaluated by the X-ray diffraction method and the scanning $\mu$-RHEED microscope.

Figure 7:
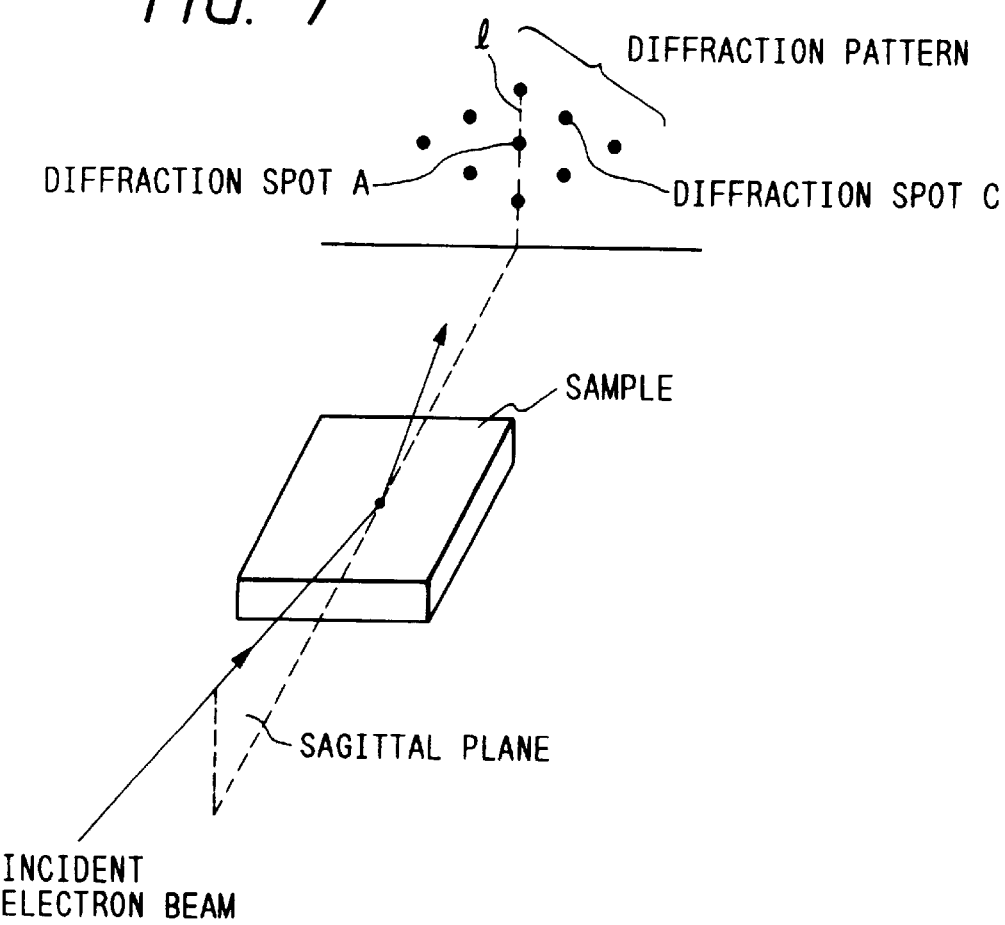
FIG. 7 is a schematic view for illustration of the scanning $\mu$-RHEED method.
Figure 8:
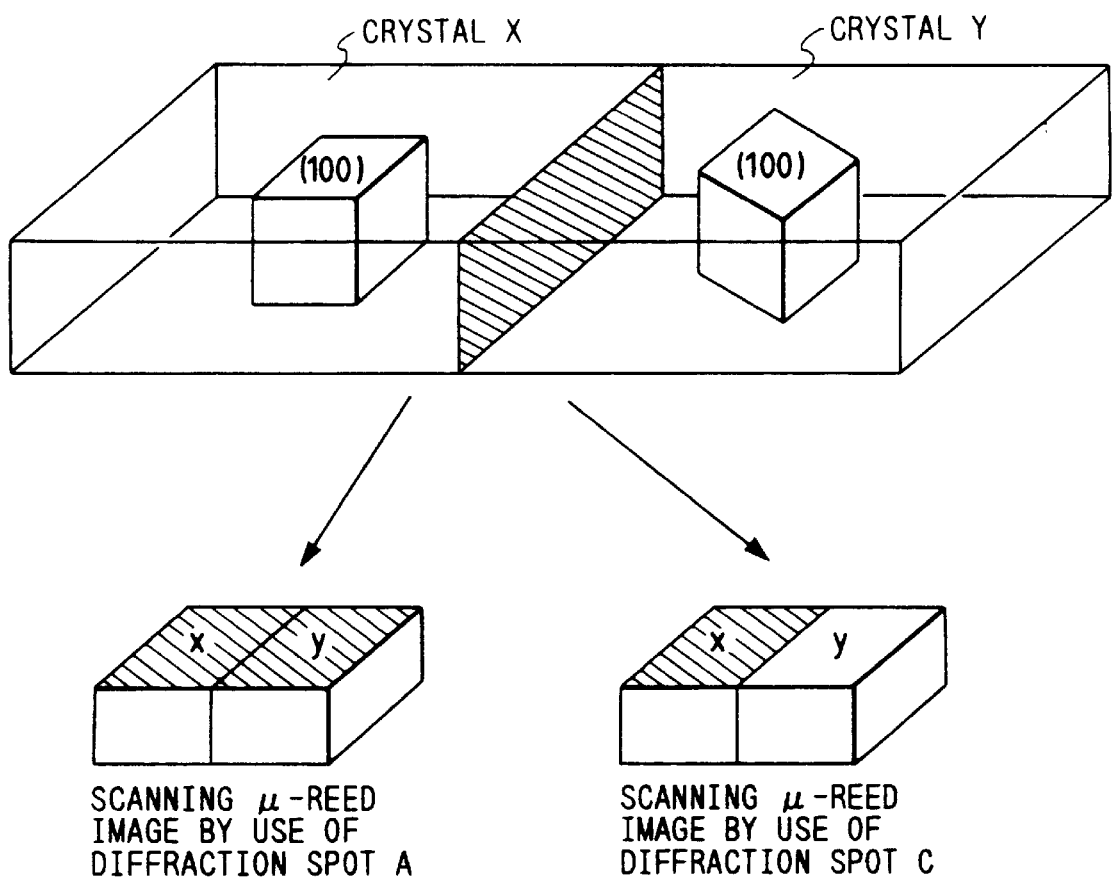
FIG. 8 is a schematic view for illustration of the scanning $\mu$-RHEED method.

The scanning $\mu$-RHEED microscope is the method disclosed in Extended Abstracts of the 21st Conference on Solid State Devices and Materials (1989) p. 217 and Japanese Journal of Applied Physics vol. 28, No. 11 (1989), L2075. According to the RHEED (Reflection High Energy Electron Diffraction) method of prior art, an electron beam was permitted to be incident on the sample surface at a shallow angle of 2°–3°, and the crystallinity of the sample surface was evaluated from the diffraction pattern formed by the diffracted electron beam. However, since the electron beam diameter is large as 100 $\mu$m to several hundred $\mu$m, only average information on the sample surface could be obtained. In the $\mu$-RHEED microscope, an electron beam diffraction pattern from a specific fine region on the sample surface can be observed by narrowing the electron beam diameter of 0.1 $\mu$m. Also, by scanning the electron beam two-dimensionally on the sample surface, by use of any desired diffraction spot intensity change on the diffraction pattern as the image signal, two dimensional image (scanning $\mu$-RHEED image) on the sample surface can be obtained. At this time by observation of the scanning $\mu$-RHEED image by use of different diffraction spots A and C on the diffraction pattern as shown in FIG. 7, even if the lattice planes in parallel to the sample surface may be aligned in (100), the crystal grain boundaries rotating within the plane can be visualized as distinguished from each other. Here, the diffraction spot A is a diffraction spot on the line (line 1) where the plane in which the diffraction pattern occurs and the sagittal plane formed by the incident electron beam are crossed at right angle, while the diffraction spot C is a diffraction spot not on the line 1. As shown in FIG. 8, when the lattice plane in parallel to the sample surface is, for example, (100), but crystal grains x and y are rotating mutually within the plane, in the scanning $\mu$-RHEED image by use of the diffraction spot A, both crystal grains x and y are displayed as the region with strong intensity. On the other hand, in the scanning $\mu$-RHEED image by use of the diffraction spot C, only the crystal grain x is displayed as the region with strong intensity. Therefore, by observation of the scanning $\mu$-RHEED image by use of the diffraction spots A and C as shown in FIG. 7, it can be discriminated whether the crystal in the region observed is a polycrystal including interplanar rotation or a monocrystal. In Extended Abstracts of the 21th Conference on Solid State Devices and Materials (1989) p. 217 and Japanese Journal of Applied Physics vol. 28, No. 11 (1989) L2075, concerning Cu thin film, it has been clarified that, for example, even if the lattice plane in parallel to the sample surface may be {100}, there exists a crystal grain including interplanar rotation in the {100} crystal grains.

First, the Al film deposited selectively on the Si exposed surface at the substrate temperature in Table 1 was evaluated.

Figure 9:
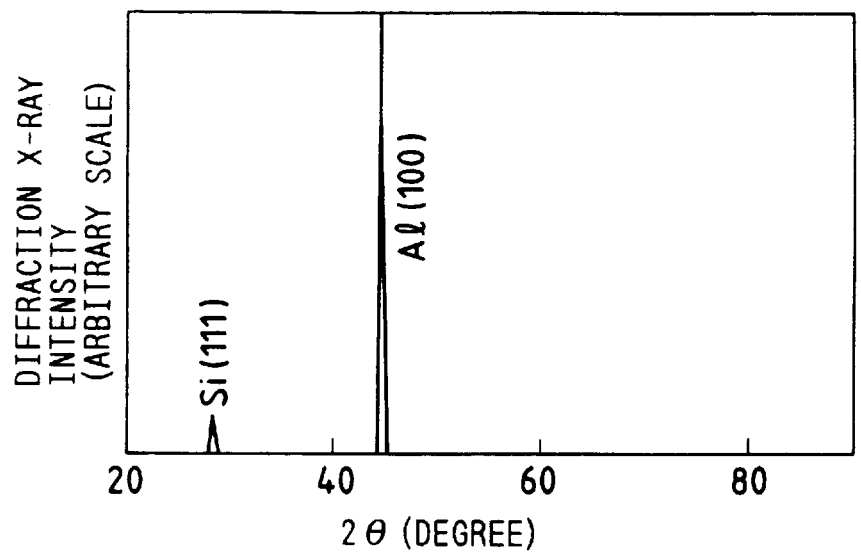
FIG. 9 is a chart showing another example of the X-ray diffraction pattern of the substrate having the Al film obtained according to the selective deposited film forming process of the present invention.
Figure 10A:
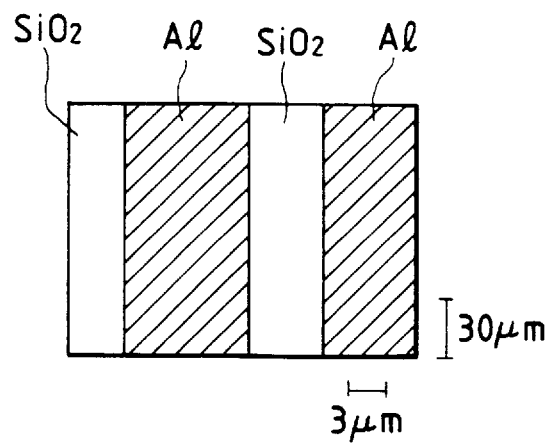
FIGS. 10A–10C are schematic views showing an example of the scanning secondary electron image and the scanning $\mu$-RHEED image of the substrate having the Al film obtained according to the selective deposited film forming process of the present invention.
Figure 10B:
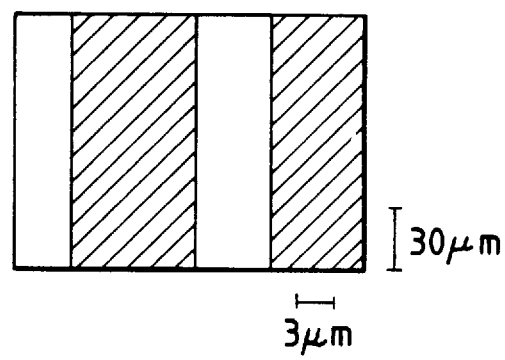
Figure 10C:
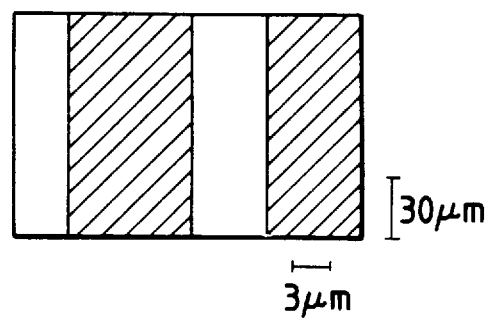

When the crystal direction on the Si substrate surface is (111) plane, from X-ray diffraction, as shown in FIG. 9, only the diffraction peak showing Al (100) could be observed. Next, crystallinity of the Al film deposited selectively was evaluated by use of a scanning $\mu$-RHEED microscope. As shown in FIG. 10, after the region where Al had been selectively deposited was specified by the scanning secondary electron image showing the surface form (FIG. 10A), by use of the diffraction spot 200 (corresponding to the diffraction spot A in FIG. 7) and the diffraction spot 620 (corresponding to the diffraction spot C in FIG. 7) on the diffraction pattern occurring when the electron beam was permitted on the Al (100) plane from the [001] direction, the scanning $\mu$-RHEED image (FIG. 10B) and FIG. 10C) was observed. As shown schematically in FIG. 10B and FIG. 10C, there is no change in lightness and darkness on the Al film selectively deposited, and the Al selectively deposited was confirmed to be an Al (100) monocrystal.

On the other hand, when the Si exposed plane is not linear but like via-hole, irrespectively of the through-hole diameter, the Al selectively deposited was found to be similarly Al (100) monocrystal. Those at substrate temperatures ranging from 250° C. to 330° C. were selectively deposited stably, and the Al obtained was found to become monocrystal.

Also, Al films deposited selectively on the Si (111) substrate with the Si (111) plane being at off-angles by 1°, 2°, 3°, 4°, 5° from the Si substrate were also found to deposit Al (100) monocrystals under the temperature conditions of the substrate temperature ranging from 250° C. to 330° C. similarly as deposited on the Si (111) substrate as described above.

Figure 11:
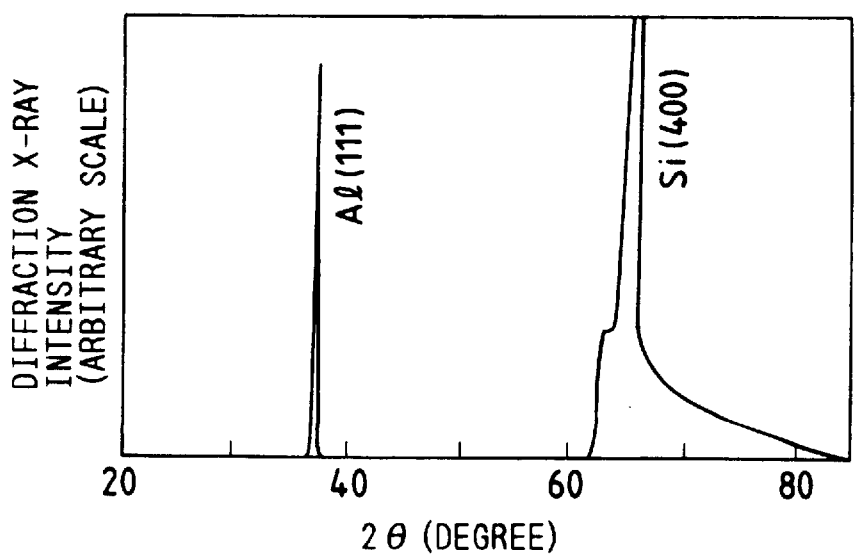
FIG. 11 is a chart showing another example of the X-ray diffraction pattern of the substrate having the Al film obtained by the selective deposited film forming process of the present invention.
Figure 12A:
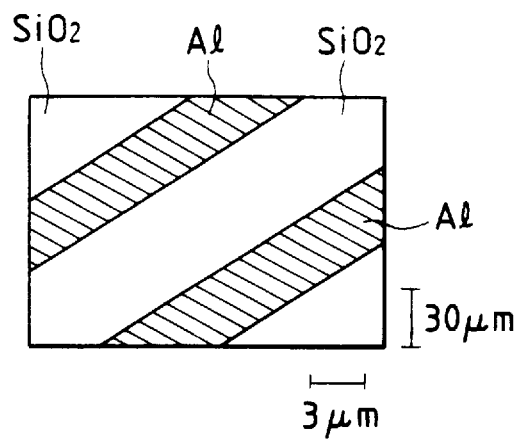
FIGS. 12A–12C are schematic views of another example of the scanning secondary electron image and the scanning $\mu$-RHEED image of the substrate having the Al film obtained according to the selective deposited film forming process of the present invention.
Figure 12B:
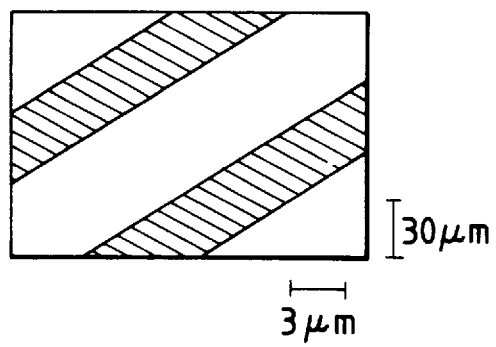
Figure 12C:
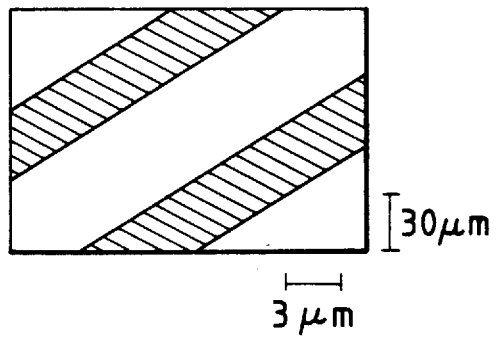

When the crystal direction of the Si substrate surface is the (100) plane, from X-ray diffraction, as shown in FIG. 11, only the diffraction peak showing Al (111) could be observed. FIG. 12 shows the scanning secondary electron image (FIG. 12A) and the scanning $\mu$-RHEED image (FIGS. 12B and 12C) when Al was selectively deposited on only the Si exposed surface on a substrate having Si (100) exposed in a line by patterning of SiO$_2$ in a line. For the scanning $\mu$-RHEED image, the 333 diffraction spots (FIG. 12B) and 531 diffraction spots (FIG. 12C) were employed. The Al film selectively deposited was confirmed to be an Al (111) monocrystal. Those at substrate temperatures ranging from 250° C. to 330° C. were found to be selectively deposited stably, and the Al films obtained became monocrystals.

Also, Al films deposited selectively on the Si (100) substrate with the Si (100) plane being at off-angles by 1°, 2°, 3°, 4°, 5° from the Si substrate surface were also found to deposit Al (111) monocrystals under the temperature conditions of the substrate temperature ranging from 250° C. to 330 ° C. similarly as deposited on the Si (111) substrate as described above.

EXPERIMENTAL EXAMPLE 14

Crystallinity of the Al film deposited selectively according to the same method as shown in Example 6 was evaluated. Similarly as in Experimental example 8, at substrate temperatures ranging from 250° C. to 330° C., Al (100) monocrystals on the Si (111) substrate and Al (111) monocrystals on Si (100) substrate were obtained stably.

EXPERIMENTAL EXAMPLE 15

Crystallinity of the Al film deposited selectively according to the same method as shown in Example 7 was evaluated.

From the scanning $\mu$-RHEED microscope observation according to the same observation method as described in Experimental example 13, when the first substrate material is Si (111), in either case when the second substrate material is T-SiO$_2$, SiO$_2$, BSG, PSG, BPSG, P-SiN, T-SiN, LP-SiN or ECR-SIN, the Al selectively deposited on Si was found to be Al (100). When the first substrate material is Si (100), in either case when the substrate material is T-SiO$_2$, SiO$_2$, BSG, PSG, BPSG, P-SiN, T-SiN, LP-SiN or ECR-SiN, the Al film selectively deposited was found to be Al (111).

When the first material is TiN, in either case when the second substrate material is T-SiO$_2$, SiO$_2$, BSG, PSG, BPSG, P-SiN, T-SiN, LP-SiN or ECR-SiN, the Al film selectively deposited on TiN was found to be oriented in Al (111) from X-ray diffraction, and from reflective high speed electron beam diffraction pattern of the prior art by use of an electron beam of an acceleration voltage of 80 kV or 100 kV, diffraction spots concerned with Al (111) were strongly observed.

COMPARATIVE EXPERIMENT

An Al film was formed on a monocrystalline silicon under the following conditions.

By passing Ar in place of H$_2$, Al was deposited by pyrolysis of DMAH. The total pressure at this time was made 1.5 Torr, the DMAH partial pressure 1.5×10$^{-4}$ Torr, and the substrate temperature 270°–350° C.

When the Al film thus formed was evaluated, it was found to contain at least about 2% of carbon.

Resistivity increases by 2-fold or more than when hydrogen was employed.

As to reflectance, it was lowered to about ⅓ to ⅑ relative the case when hydrogen was employed.

Similarly, wiring life was shorter by 1 to 2 cipher, generation probability of hillock became greater by 2 cipher or more, and a large number of spikes were found to be generated.

As to the deposition speed, it was lowered to ½ to ¼.

As described above, Al deposited only by decomposition of DMAH without use of H$_2$ is inferior in film quality, and was unsatisfactory as the Al film for a semiconductor device.

Separately, without use of H$_2$, DMAH was decomposed by the optical CVD method to deposit Al. As the result, some improvement such as no contamination by carbon, and the like was observed from the Al film prepared as compared with the case when no light was employed, but other characteristics were not improved, and the Al film was still unsatisfactory as the Al film for a semiconductor device.

As described above, the mechanism of Al deposition according to the present invention may be presently hypothesized as follows.

Figure 13A:
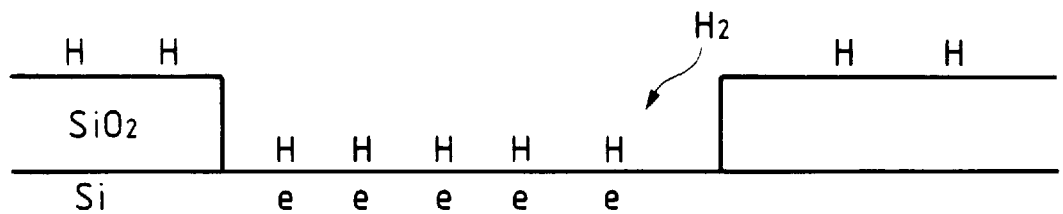
FIGS. 13A–13D are illustrations for explaining the mechanism of Al deposition according to the present invention.
Figure 13B:
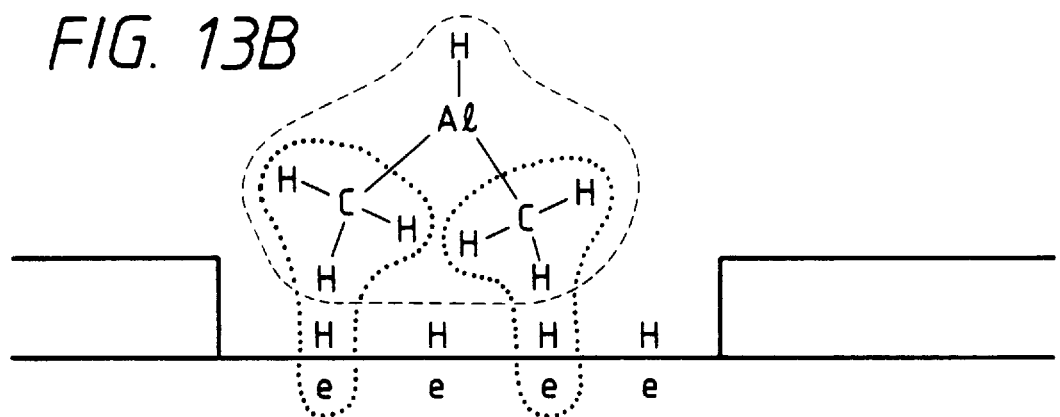
Figure 13C:
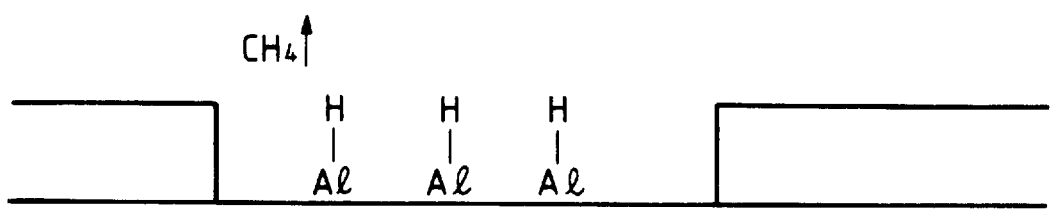

When DMAH reaches the electron donative substrate, namely the substrate having electrons under the state on which hydrogen atoms are attached (FIG. 13A) with the methyl groups directed toward the substrate side, one electron of the substrate cuts one bond of the Al and methyl group (FIGS. 13B, 13C).

The reaction scheme at this time is as follows:

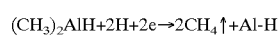

Figure 13D:
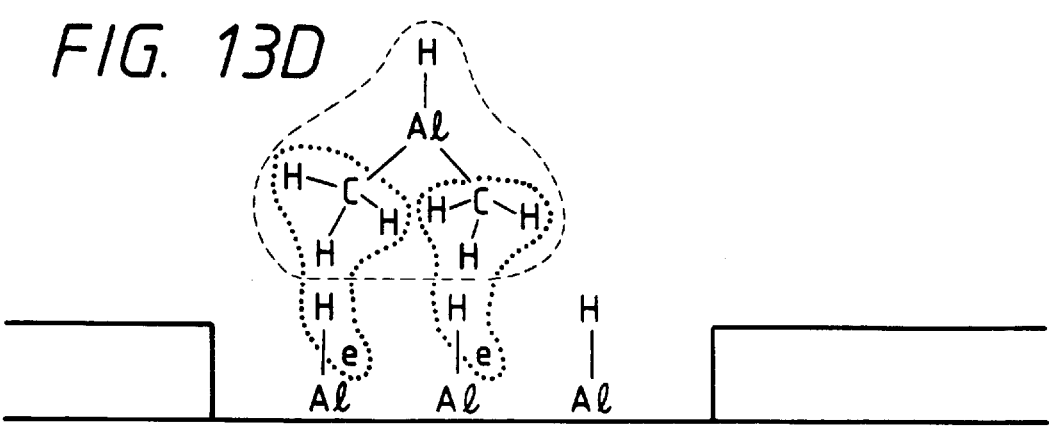

Further, similar reactions will proceed for the hydrogen atoms remaining on deposited Al having free electrons (FIG. 13D). Here, when hydrogen atoms are deficient, hydrogen molecules constituting the reaction gas are decomposed on the substrate to supply hydrogen atoms. On the other hand, since there is no electron on the electron non-donative surface, the above-mentioned reaction will not proceed and no Al is deposited.

FIGS. 13A–13D are illustrations for better understanding of the reacion mechanism, and the numbers of H, e and Al shown in FIGS. 13A–13D are not necessarily coincident.

As described above, according to the present invention, a low resistivity, dense and flat Al film can be deposited on a substrate.

Also, depending on the kind of the substrate, deposition can be effected selectively.

What we claim is:

1. A method for selectively forming an aluminum thin film, comprising the steps of:
   forming on a silicon substrate an oxidized film mask having an opening and
   introducing dimethyl aluminum hydride as a starting gas onto the silicon substrate by a chemical vapor deposition method to selectively deposit an aluminum thin film only on a silicon surface exposed from the opening.

2. A chemical vapor deposition method for depositing a metal film containing aluminum on a substrate provided in a chamber for formation of a deposited film, comprising the steps of:
   (a) maintaining the pressure inside the chamber at a pressure within the range from $10^{-3}$ to 760 Torr;
   (b) introducing a gas of alkyl aluminum hydride and hydrogen gas into the chamber sufficient to provide a partial pressure of the gas of alkyl aluminum hydride from $1.5 \times 10^{-5}$ to $1.3 \times 10^{-3}$ of the pressure inside the chamber; and
   (c) maintaining a substrate temperature sufficient to decompose said alkyl aluminum hydride to deposit a metal film containing aluminum on a conductive or semiconductive surface of the substrate.

3. A chemical vapor deposition method for depositing a metal film containing aluminum on a plurality of substrates provided in a chamber for formation of a deposited film, comprising the steps of:
   (a) maintaining the pressure inside the chamber at a pressure within the range from $10^{-3}$ to 760 Torr;
   (b) introducing a gas of alkyl aluminum hydride and hydrogen gas into the chamber sufficient to provide a partial pressure of the gas of alkyl aluminum hydride from $1.5 \times 10^{-5}$ to $1.3 \times 10^{-3}$ of the pressure inside the chamber; and
   (c) maintaining a plurality of substrates at a temperature sufficient to decompose said alkyl aluminum hydride to deposit a metal film containing aluminum on a conductive or semiconductive surface of each one of the plurality of substrates.

4. A chemical vapor deposition method for depositing a metal film containing aluminum on a substrate having an insulating surface and a semiconductive surface or a conductive surface provided in a chamber for formation of a deposited film, comprising the steps of:
   (a) maintaining the pressure inside the chamber at a pressure within the range from $10^{-3}$ to 760 Torr;
   (b) introducing a gas of alkyl aluminum hydride and hydrogen gas into the chamber sufficient to provide a partial pressure of the gas of alkyl aluminum hydride from $1.5 \times 10^{-5}$ to $1.3 \times 10^{-3}$ of the pressure inside the chamber; and
   (c) maintaining a substrate temperature sufficient to decompose said alkyl aluminum hydride to selectively deposit a metal film containing aluminum on the semiconductive surface or the conductive surface of the substrate.

5. A chemical vapor deposition method for depositing a metal film containing aluminum on a plurality of substrates each having an insulating surface and a semiconductive surface or a conductive surface provided in a chamber for formation of a deposited film, comprising the steps of:
   (a) maintaining the pressure inside the chamber at a pressure within the range from $10^{-3}$ to 760 Torr;
   (b) introducing a gas of alkyl aluminum hydride and hydrogen gas into the chamber sufficient to provide a partial pressure of the gas of alkyl aluminum hydride from $1.5 \times 10^{-5}$ to $1.3 \times 10^{-3}$ of the pressure inside the chamber; and
   (c) maintaining the substrate temperature sufficient to decompose said alkyl aluminum hydride to selectively deposit a metal film containing said aluminum on the semiconductive surface or the conductive surface of the plurality of substrates.

6. The chemical vapor deposition method according to any one of claims 2 to 5, wherein the alkyl aluminum hydride is dimethyl aluminum hydride.

7. A chemical vapor deposition method for depositing a metal film containing aluminum on a substrate provided in a chamber for formation of a deposited film, comprising the steps of:
   (a) maintaining the pressure inside the chamber at a pressure within the range from $10^{-3}$ to 760 Torr;
   (b) introducing a gas of alkyl aluminum hydride and hydrogen gas into the chamber; and
   (c) maintaining a substrate temperature sufficient to decompose said alkyl aluminum hydride to deposit a metal film containing aluminum on a conductive or semiconductive surface of the substrate, the conductive or semiconductive surface comprising a metallic nitride.

8. A chemical vapor deposition method for depositing a metal film containing aluminum on a plurality of substrates provided in a chamber for formation of a deposited film comprising the steps of:
   (a) maintaining the pressure inside the chamber at a pressure within the range from $10^{-3}$ to 760 Torr;
   (b) introducing a gas of alkyl aluminum hydride and hydrogen gas into the chamber; and
   (c) maintaining a plurality of substrates at a temperature sufficient to decompose said alkyl aluminum hydride to deposit a metal film containing aluminum on a conductive or semiconductive surface of each one of the plurality of substrates, the conductive or semiconductive surface comprising a metallic nitride.

9. A chemical vapor deposition method for depositing a metal film containing aluminum on a substrate having an insulating surface and a semiconductive surface or a conductive surface provided in a chamber for formation of a deposited film, comprising the steps of:
   (a) maintaining the pressure inside the chamber at a pressure within the range from $10^{-3}$ to 760 Torr;
   (b) introducing a gas of alkyl aluminum hydride and hydrogen gas into the chamber; and (c) maintaining a substrate temperature sufficient to decompose said alkyl aluminum hydride to selectively deposit a metal film containing aluminum on the semiconductive surface or the conductive surface of the substrate, the conductive or semiconductive surface comprising a metallic nitride.

10. A chemical vapor deposition method for depositing a metal film containing aluminum on a plurality of substrates each having an insulating surface and a semiconductive surface or a conductive surface provided in a chamber for formation of a deposited film, comprising the steps of:

(a) maintaining the pressure inside the chamber at a pressure within the range from $10^{-3}$ to 760 Torr;

(b) introducing a gas of alkyl aluminum hydride and hydrogen gas into the chamber; and (c) maintaining the substrate temperature sufficient to decompose said alkyl aluminum hydride to selectively deposit a metal film containing said aluminum on the semiconductive surface or the conductive surface of the plurality of substrates, the conductive or semiconductive surface comprising a metallic nitride.

11. A chemical vapor deposition method for depositing a metal film containing aluminum on a substrate provided in a chamber for formation of a deposited film, comprising the steps of:

(a) maintaining the pressure inside the chamber at a pressure within the range from $10^{-3}$ to 760 Torr;

(b) introducing a gas of dimethyl aluminum hydride and hydrogen gas into the chamber; and (c) maintaining a substrate temperature sufficient to decompose said dimethyl aluminum hydride to deposit a metal film containing aluminum on a conductive or semiconductive surface of the substrate, the conductive or semiconductive surface comprising titanium nitride.

12. A chemical vapor deposition method for depositing a metal film containing aluminum on a plurality of substrates provided in a chamber for formation of a deposited film, comprising the steps of:

(a) maintaining the pressure inside the chamber at a pressure within the range from $10^{-3}$ to 760 Torr;

(b) introducing a gas of dimethyl aluminum hydride and hydrogen gas into the chamber; and (c) maintaining a plurality of substrates at a temperature sufficient to decompose said dimethyl aluminum hydride to deposit a metal film containing aluminum on a conductive or semiconductive surface of each one of the plurality of substrates, the conductive or semiconductive surface comprising titanium nitride.

13. A chemical vapor deposition method for depositing a metal film containing aluminum on a substrate having an insulating surface and semiconductive surface or a conductive surface provided in a chamber for formation of a deposited film, comprising the steps of:

(a) maintaining the pressure inside the chamber at a pressure within the range from $10^{-3}$ to 760 Torr;

(b) introducing a gas of dimethyl aluminum hydride and hydrogen gas into the chamber; and (c) maintaining a substrate temperature sufficient to decompose said dimethyl aluminum hydride to deposit selectively a metal film containing aluminum on the semiconductive surface or the conductive surface of the substrate, the conductive or semiconductive surface comprising titanium nitride.

14. A chemical vapor deposition method for depositing a metal film containing aluminum on a plurality of substrates each having an insulating surface and a semiconductive surface or a conductive surface provided in a chamber for formation of a deposited film, comprising the steps of:

(a) maintaining the pressure inside the chamber at a pressure within the range from $10^{-3}$ to 760 Torr;

(b) introducing a gas of dimethyl aluminum hydride and hydrogen gas into the chamber; and (c) maintaining the substrate temperature sufficient to decompose said dimethyl aluminum hydride to selectively deposit a metal film containing said aluminum on the semiconductive surface or the conductive surface of the plurality of substrates, the conductive or semiconductive surface comprising titanium nitride.

* * * * *

UNITED STATES PATENT AND TRADEMARK OFFICE
CERTIFICATE OF CORRECTION

PATENT NO. : 5,824,150
DATED : October 20, 1998
INVENTOR(S) : Nobuo Mikoshiba et al.

It is certified that error appears in the above-identified patent and that said Letters Patent is hereby corrected as shown below:

Title page,
Item [56], References Cited, FOREIGN PATENT DOCUMENTS,
"1198475  8/1989  Japan." (2nd occurrence) should be deleted.
"62105422  5/1987  Japan." (2nd occurrence) should be deleted.

Column 1,
Line 29, "of Al or" should read -- or Al --
Line 29, "has used the prior art" should read -- the prior art has used --
Line 43, "are" should read -- and --
Line 56, "particularly," should read -- particular, --.
Line 57, "a" should read -- an --.
Line 60, "or" should read -- or a --.

Column 2,
Line 30, "as the formation method of" should be deleted.

Column 3,
Line 7, "method." should read -- method is described. --.
Line 8, "method is described," should read -- method, --.
Line 17, "pipline" should read -- pipeline must --.

Column 5,
Line 65, "atmosphere the," should read -- atmosphere, the --.

Column 6,
Line 5, "group on" should read -- group, or --
Line 7, "atom," should read -- atom, and --

Column 7,
Line 26, "Further" should read -- Further, --.
Line 48, "meterial" should read -- material, --.

Column 9,
Line 9, "desirable," should read -- desirable. --
Line 10, "where" should read -- When --.
Line 10, "condition," should read -- conditions, --.
Line 18, "condition" should read -- conditions --.
Line 21, "on" should read -- or --.
Line 32, "simultaneous" should read -- simultaneously --.

UNITED STATES PATENT AND TRADEMARK OFFICE
CERTIFICATE OF CORRECTION

PATENT NO. : 5,824,150
DATED : October 20, 1998
INVENTOR(S) : Nobuo Mikoshiba et al.

It is certified that error appears in the above-identified patent and that said Letters Patent is hereby corrected as shown below:

Column 10,
Line 16, "little content of impurity" should read -- few impurities --.
Line 17, "bulk, resistivity" should read -- bulk resistivity, --.
Line 26, "monocrystal line" should read -- monocrystalline --.
Line 41, "evaluated" should read -- evaluated by --.

Column 11,
Line 59, "deposit ion" should read -- deposition --.
Line 59, "i s" should read -- is --.

Column 12,
Line 28, "on" should read -- or --.
Line 45, "$1x10^{-5}$ fold" should read -- $1x10^{-5}$-fold --.

Column 14,
Table 1, " $0-^{*}$ " should read -- 0 --.

Column 16,
Line 51, "Conditions." should be deleted.
Line 60, "samples, was examined" should read -- samples was examined --.

Column 17,
Line 5, "5B" should read -- 5B is --.

Column 18,
Line 11, "6 to 8" shouldread -- 5 to 8 --.
Line 12, "16" should read -- 15 --.
Line 15, delete entire line.
Line 16, "example is as follows" should be deleted.
Line 30, "3" should read -- a --.

Column 20,
Line 47, "Reflectance," should read -- reflectance, were --.
Line 48, "8 were obtained." should read -- 8. --.

UNITED STATES PATENT AND TRADEMARK OFFICE
CERTIFICATE OF CORRECTION

PATENT NO. : 5,824,150
DATED : October 20, 1998
INVENTOR(S) : Nobuo Mikoshiba et al.

It is certified that error appears in the above-identified patent and that said Letters Patent is hereby corrected as shown below:

Column 21,
Line 3, "namely" should be deleted.
Line 4 "$\mu$m," should read -- $\mu$m. --.
Line 5, "$SiO_2$" should read -- $SiO_2$ --.
Line 6, "T-$SiO_2$)" should read -- "T-$SiO_2$) --.
Line 7, "con"." should read -- con'.) --.

Column 22,
Table 3, "5-14" (under "TiSi")" should read -- 5-74 --.

Column 23,
Table 3, "5-131" (in "PSG" line) should read -- 5-134 --.

Column 24,
Table 4, "6-85" (P-SiN line) should read -- 6-86 --.
Table 4, "6-121" (PSG line) should read -- 6-124 --.
Line 64, "21th" should read -- 21st --.

Column 25,
Line 19, "10B)" should read -- 10B --.
Line 26, "via-hole," should read -- a through-hole, --.

Column 27,
Line 10, "reacion" should read -- reaction --.

Signed and Sealed this

Fourteenth Day of September, 2004

JON W. DUDAS
*Director of the United States Patent and Trademark Office*